United States Patent [19]

Furutani

[11] Patent Number: 5,631,873
[45] Date of Patent: May 20, 1997

[54] SEMICONDUCTOR MEMORY

[75] Inventor: Kiyohiro Furutani, Tokyo, Japan

[73] Assignee: Mitsubishi Denki Kabushiki Kaisha, Tokyo, Japan

[21] Appl. No.: 567,419

[22] Filed: Dec. 5, 1995

[30] Foreign Application Priority Data

May 23, 1995 [JP] Japan ..................... 7-123879

[51] Int. Cl.$^6$ ..................................... G11C 8/00
[52] U.S. Cl. .................. 365/230.06; 365/230.01; 365/230.03
[58] Field of Search ............. 365/230.06, 230.03, 365/230.08, 230.04, 230.01

[56] References Cited

U.S. PATENT DOCUMENTS

| | | | |
|---|---|---|---|
| 4,344,005 | 8/1982 | Stewart | 365/230.06 |
| 4,833,650 | 5/1989 | Hirayama et al. | 365/230.01 |
| 5,175,835 | 12/1992 | Beighe et al. | 365/230.01 |
| 5,335,204 | 8/1994 | Matsuo et al. | 365/230.01 |

OTHER PUBLICATIONS

1990 IEEE International Solid–State Circuits Conference, pp. 230–231, Feb. 16, 1990, Yasuhiro Konishi, et al., "A 38ns 4Mb DRAM With A Battery Back–up (BBU)Mode".

Primary Examiner—Tan T. Nguyen
Attorney, Agent, or Firm—Oblon, Spivak, McClelland, Maier & Neustadt, P.C.

[57] ABSTRACT

A block selection signal generating circuit (70) outputs block selection signals (BSa, BSb, BSc, BSd). When the changeover signal (NORMAL) is "L", only one of the block selection signals (BSa, BSb, BSc, BSd) becomes "H" if the value of the column address (CA<12:11>) as the block address are "00", "01", "10", "11", respectively. The block address is obtained ahead of the row address RA<12:0>. Only one of the sense amplifiers (40a to 40d) corresponding to the column specified by the block address is driven to save the power consumption.

4 Claims, 17 Drawing Sheets

FIG. 2
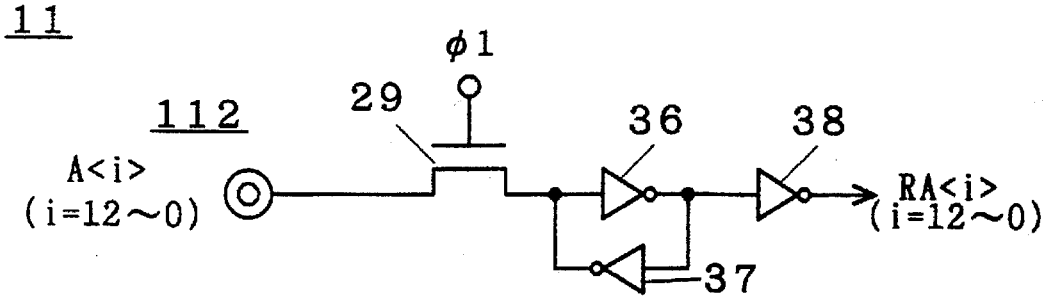
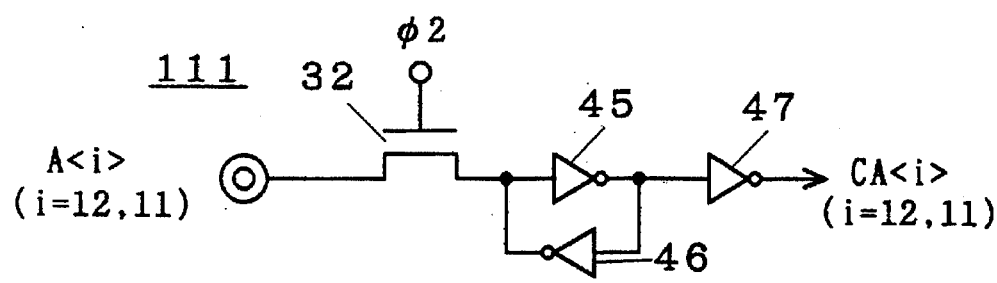
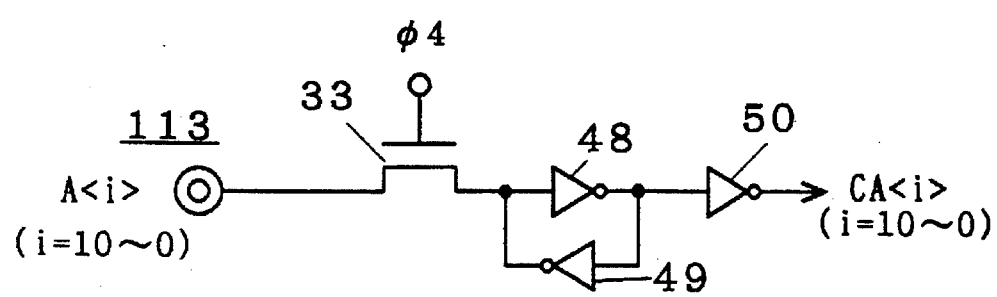
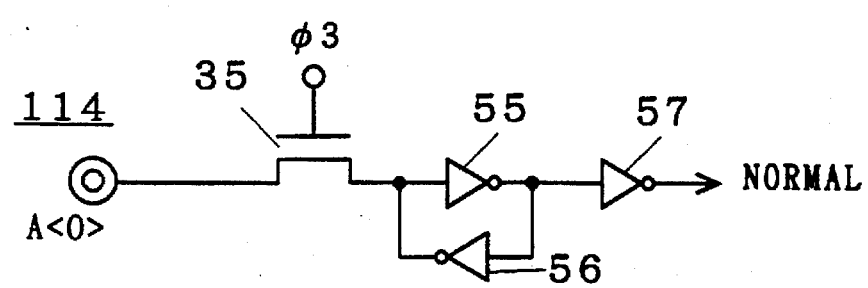

FIG. 14
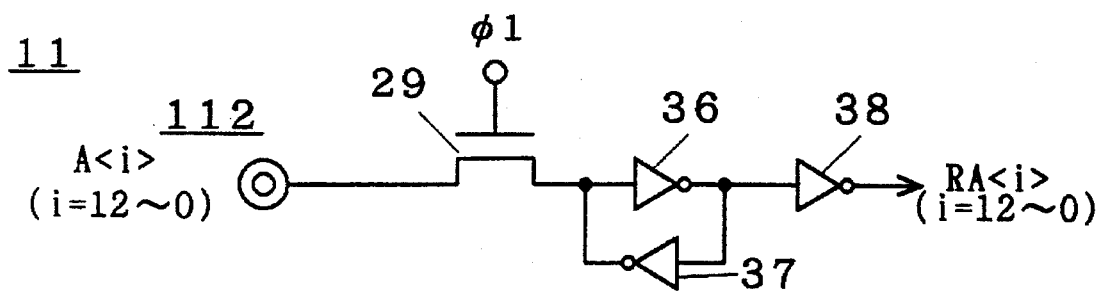
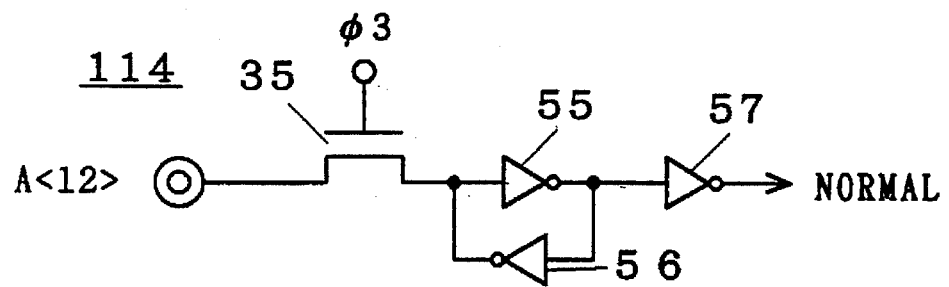
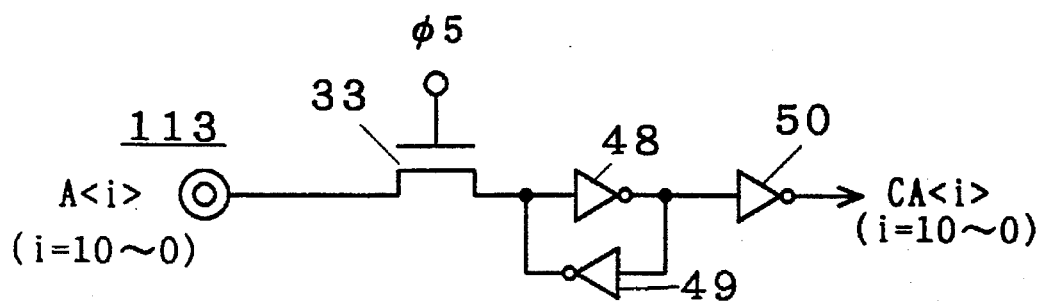

SEMICONDUCTOR MEMORY

BACKGROUND OF THE INVENTION

1. Field of the Invention

The present invention relates to a DRAM, and more particularly to a technology for reducing the power consumption thereof.

2. Description of the Background Art

The DRAM is advanced in integration year after year, and recently mass production of 64M DRAMs has been started. A 64M DRAM comprises 64M ($=2^{26}$ pieces) of memory cells, and a 26-bit address signal is needed for specifying one of them. To decrease the number of pins and save cost, however, an address signal is entered by dividing into two portions from 13 address pins.

FIG. 17 is a circuit diagram showing an outline of a 64M DRAM in a conventional constitution. In a conventional 64M DRAM 200, 64M ($=2^{26}$ pieces) of memory cells are divided into four memory cell arrays 6a to 6d each having 16M ($=2^{24}$ pieces) of memory cells. Each memory cell array 6x (x=a, b, c, d; same hereinafter) contains memory cells MCx arranged in a matrix form of 8192($=2^{13}$) lines×2048 ($=2^{11}$) rows. FIG. 18 is a circuit diagram showing an example of a structure of memory cell MCx.

FIG. 19 is a timing chart showing the operation of the 64M DRAM 200. At time t11 when the control signal $\overline{RAS}$ is changed to "L" (activated), a control circuit 1 applies a 13-bit address (row address) given to the address pin A<12:0> to row decoders 3a to 3d. Each row decoder 3x selects a word line $WL_i$ (i=0 to 8191) corresponding to one row of the memory cell array 6x according to the row address. One word line $WL_i$ corresponds to 2048 memory cells MCx in each memory cell array 6x, and hence in the entire 64M DRAM 200, 8192 memory cells correspond to one word line $WL_i$.

However, since the row decoders 3x are disposed in four positions, and the word line $WL_i$ is divided in each memory cell array 6x, its length is suppressed. Accordingly, the delay in the word line $WL_i$ is smaller, so that the access time is shortened.

On the other hand, 2048 sense amplifiers 5x provided in each output unit 4x differentially amplify the signal read out to the bit line BL to which 2048 memory cells corresponding to the selected word line $WL_i$ are connected, and the signal read out to a dummy memory cell (not shown) connected to inverted bit line $\overline{BL}$, and each signal is given to NMOS transistors 7x, 8x. Both NMOS transistors 7x, 8x are provided by 2048 pieces each corresponding to the sense amplifiers 5x.

At time t12 when the control signal $\overline{CAS}$ is changed to "L" (activated), the control circuit 1 applies the 13-bit address (column address) given to the address pin A<12:00> to a column decoder 2. The column decoder 2, according to the column address, activates one of the column selection line groups Y, and selects a pair out of the outputs from the 2048 sense amplifiers 5x provided in each output unit 4x, and gives to the I/O line and $\overline{I/O}$ lines.

Of the column addresses CA<12:00>, when the pair of CA<12:11> is "00", "01", "10" or "11", a pair of NMOS transistors provided in the output units 4a, 4b, 4c, 4d are made to conduct, respectively.

To access a memory cell of the same row address, it is not necessary to feed the row address newly, but the control signal $\overline{CAS}$ is activated successively at time t13, and a new column address may be entered.

The conventional 64M DRAM 200 is operated in this way, and all of 8192 sense amplifiers operate in order to read out the data of one memory cell, and the power consumption is thus significant.

SUMMARY OF THE INVENTION

A first aspect of the present invention relates to a semiconductor memory device comprising memory cells the number of which is m, address pins the number of which is n, and a row decoder for selecting a specific number of the memory cells out of m thereof, wherein the row decoder selects $m/2^k$ of the memory cells out of m thereof based on a binary signal of k bits (more than n bits) which is composed of a signal inputted from the address pins just at a time when a control signal for specifying a beginning and an end of access operation specifies the end of access operation, and a signal inputted from the address pins just at a time when the control signals specifies the beginning of access operation.

In a conventional semiconductor memory device, $m/2^n$ of memory cells out of m thereof are activated based on a binary signal of n bits inputted from n pieces of the address pins just at a time when the control signal specifies a beginning of access operation. According to the first aspect of the present invention, since $m/2^k$ of memory cells smaller than $m/2^n$ thereof are activated, the power consumption has been reduced.

A second aspect of the present invention relates to a semiconductor memory device comprising memory cells the number of which is m, address pins the number of which is n, a row decoder for selecting a specific number of the memory cells out of m thereof, and a mode changeover circuit for changing over an operation mode of a semiconductor memory device to first and second operation modes, wherein the row decoder selects, in the first mode, $m/2^n$ of the memory cells out of m thereof based on a binary signal of n bits inputted from the address pins just at a time when a control signal for specifying a beginning and an end of access operation specifies the beginning of access operation, and in the second mode, $m/2^k$ of the memory cells out of m thereof based on a binary signal of k bits (more than n bits) which is composed of a signal inputted from the address pins just at a time when the control signal specifies the end of access operation, and a signal inputted from the address pins just at a time when the control signal specifies the beginning of access operation.

According to the second aspect of the present invention, a first access operation is performed in a first operation mode at high-speed like in a conventional semiconductor memory device, and after next access, operation is performed in a second operation mode in the case of page fault. This makes it possible to reduce the power consumption without the deterioration of the processing speed.

A third aspect of the present invention relates to a semiconductor memory device, wherein the mode changeover circuit regulates an operation mode for a period from a time when the control signal specifies a beginning of next access operation to an end of the access operation in the semiconductor memory device, according to a state of a signal applied to the semiconductor memory device just at a time when the control signal specifies the end of access operation.

According to the third aspect of the present invention, the semiconductor memory device can specify an operation mode for every access operation.

A fourth aspect of the present invention relates to a signal processing device comprising the semiconductor memory device of the second aspect of the present invention as a memory device, and a memory device controlling device for controlling the semiconductor memory device in accordance with a request of the signal processing device, wherein the memory device controlling device operates the semiconductor memory device in a first mode in response to a first request for memory access of the signal processing device, and operates the semiconductor memory device in a second mode in the case of page fault in next memory access operation.

According to the fourth aspect of the present invention, the signal processing device has achieved the reduction of the power consumption without the deterioration of access time from the semiconductor memory device.

A fifth aspect of the present invention relates to a semiconductor memory device comprising word lines distinguished by an address signal of k bits and each provided with p memory cells, and address pins the number of which is n, wherein the number of the word lines is 2k, and if $k<2^n$, k bits requisite for specifying the word lines are composed of a signal inputted from the address pins just at a time when a control signal for specifying a beginning and an end of access operation specifies the end of access operation, and a signal inputted from the address pins just at a time when the control signal specifies the beginning of access operation.

According to the fifth aspect of the present invention, the required address signals are all completed at a time when the control signal sepecifies a beginning of access operation, so that it can be possible to improve access speed without inputting additional column addresses. Since the address signals of more than n bits are applied to activate only a smaller number of memory cells as compared with $m/2^n$ pieces of memory cells in a conventional device, the power consumption has been reduced.

It is therefore an object of the present invention to provide a technology of curtailing the number of operating sense amplifiers to save the power consumption to solve the problems in the conventional art.

These and other objects, features, aspects and advantages of the present invention will become more apparent from the following description of the present invention when taken in conjunction with the accompanying drawings.

BRIEF DESCRIPTION OF THE DRAWINGS

FIGS. 1 to 3 are circuit diagrams showing the constitution of a first preferred embodiment of the invention.

FIGS. 12 to 15 are circuit diagrams showing the constitution of a third preferred embodiment of the invention.

DESCRIPTION OF THE PREFERRED EMBODIMENTS

First Preferred Embodiment

Figure 1:
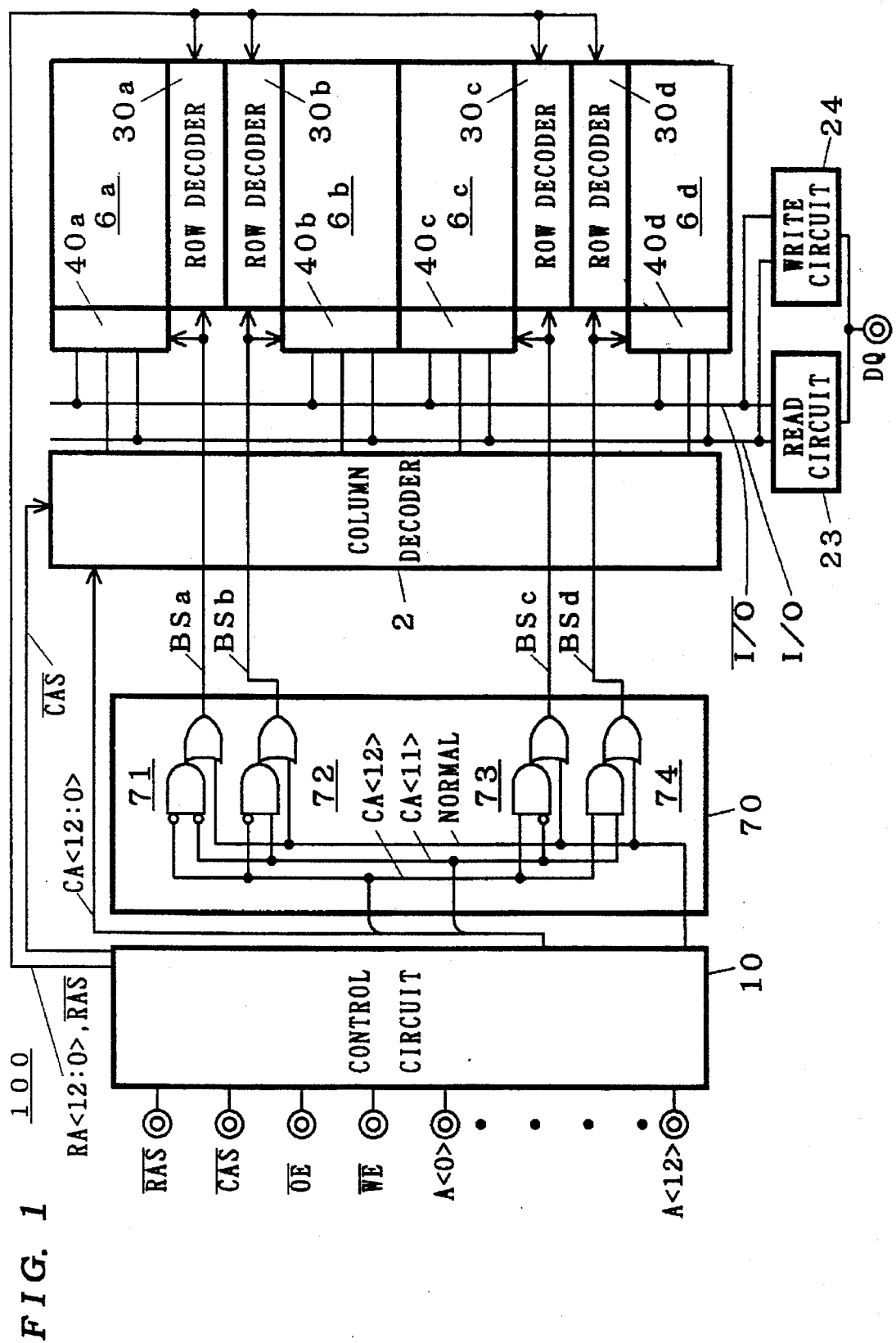

FIG. 1 is a circuit diagram showing the constitution of a first preferred embodiment of the invention. In the specification herein, the logic values "1" and "0" are respectively equivalent to the logic values "H" and "L".

A 64M DRAM 100 comprises, the same as the conventional 64M DRAM 200, four memory cell arrays 6a to 6d, each possessing 16M ($=2^{24}$ pieces) of memory cells, and a column decoder 2. It also possesses row decoders 30x and output units 40x corresponding to the memory cell arrays 6x. They respectively correspond to the row decoders 3x and output units 4x in the conventional 64M DRAM 200, except that their functions are turned on or off by block selection signals BSx.

Both I/O lines and $\overline{I/O}$ lines are connected to a read circuit 23 and a write circuit 24. The data inputted to the data input/output terminal DQ is given to the write circuit 24, and is written on the I/O lines and $\overline{I/O}$ lines at a specific timing. The data being read out on the I/O lines and $\overline{I/O}$ lines is outputted into the data input/output terminal DQ by the read circuit 23 at a specific timing. The block selection signals BSx are generated by a block selection signal generating circuit 70. The block selection signal generating circuit 70 obtains changeover signal NORMAL and the most significant two bits of column address CA<12:11> from a control circuit 10, and outputs the block selection signals BSx.

The block selection signal generating circuit 70 possesses compound gates 71, 72, 73, 74, from which block selection signals BSa, BSb, BSc, BSd are obtained respectively. More specifically, when the changeover signal NORMAL is "H", all block selection signals BSx are "H". On the other hand, when the changeover signal NORMAL is "L", in the case of the two bits of the column address CA<12:11> in the values of "00", "01 ", "10", "11", only the corresponding block selection signals BSa, BSb, BSc, BSd become "H".

The control circuit 10 comprises an address generating circuit 11 for generating changeover signal NORMAL, row address RA<12:0> and column address <12:0>, and a control clock signal generating circuit 15 for generating clock signals $\phi 1$ to $\phi 4$. Of course, the control circuit 10 can contain also the block selection signal generating circuit 70.

Figure 3:
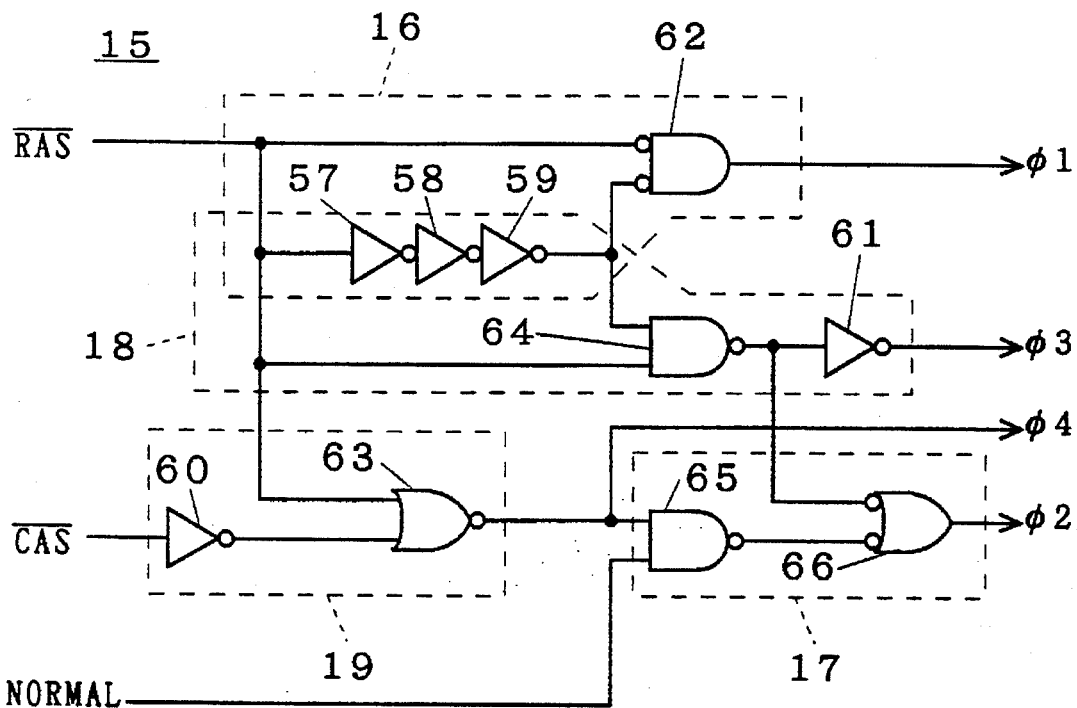

FIG. 2 and FIG. 3 are circuit diagrams showing the address generating circuit 11 and the clock signal generating circuit 15, respectively.

In FIG. 2, the address generating circuit 11 is divided into address generating units 111 to 114. In FIG. 3, the clock signal generating circuit 15 is divided into clock signal generating units 16 to 19 for generating clock signals $\phi 1$ to $\phi 4$, respectively.

The address generating unit 111 comprises an NMOS transistor 32 which is conducted by clock signal $\phi 2$, inverters 45, 46 for composing a latch, and an inverter 47. Each one of them is provided for the portion of 2 bits. According to the data given to the address pins A<12:11 > of the control circuit 10, the two bits of the column address CA<12:11> are outputted.

The address generating unit 112 comprises an NMOS transistor 29 which is conducted by clock signal $\phi 1$, inverters 36, 37 for composing a latch, and an inverter 38. Each one of them is provided for the portion of 13 bits. According to the data given to the address pins A<12:0> of the control circuit 10, the row address RA<12:0> is outputted.

The address generating unit 113 comprises an NMOS transistor 33 which is conducted by clock signal $\phi 4$, inverters 48, 49 for composing a latch, and an inverter 50. Each one of them is provided for the portion of 11 bits. According to the data given to the address pins A<10:0> of the control circuit 10, the lower 11 bits of the column address CA<10:0> are outputted.

The address generating unit 114 comprises an NMOS transistor 35 which is conducted by clock signal $\phi3$, inverters 55, 56 for composing a latch, and an inverter 57, and according to the data given to the address pin A<0> of the control circuit 10, a changeover signal NORMAL is outputted.

The clock signal generating unit 16 comprises inverters 57 to 59 for delaying a control signal $\overline{RAS}$ and inverting its logic, and a NOR gate 62 for inverting the output of the inverter 59 and the control signal $\overline{RAS}$, and outputting the logical multiplication of them as clock signal $\phi1$.

The clock signal generating unit 18 comprises an NAND gate for inverting the logical multiplication of the output of the inverter 59 and the control signal $\overline{RAS}$, and an inverter 61 for outputting the logical inversion of the output of the NAND gate 64 as clock signal $\phi3$.

The clock signal generating unit 19 comprises an inverter 60 for giving logical inversion of the control signal $\overline{CAS}$, and an NOR gate 63 for outputting the logical inversion of the logical sum of the output from the inverter 60 and the control signal $\overline{RAS}$ as clock signal $\phi4$.

The clock signal generating unit 17 comprises a NAND gate 65 for giving logical inversion of the logical multiplication of the clock signal $\phi4$ and the changeover signal NORMAL, and a NAND gate 66 for outputting the logical sum of the logical inversion of the outputs of the NAND gates 64, 65 as clock signal $\phi2$.

Figure 4:
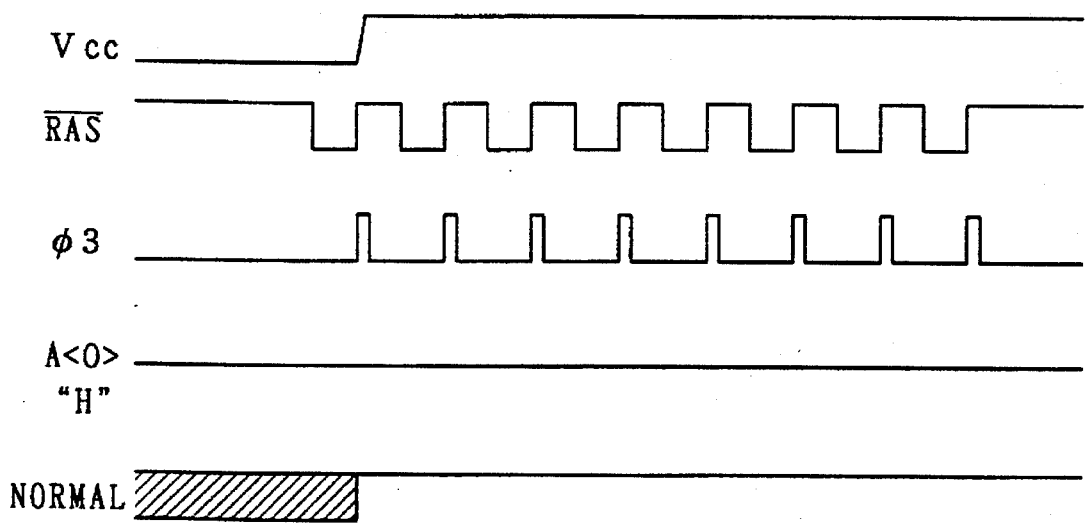
FIGS. 4 and 5 are timing charts for explaining the operation of the first preferred embodiment of the invention.
Figure 5:
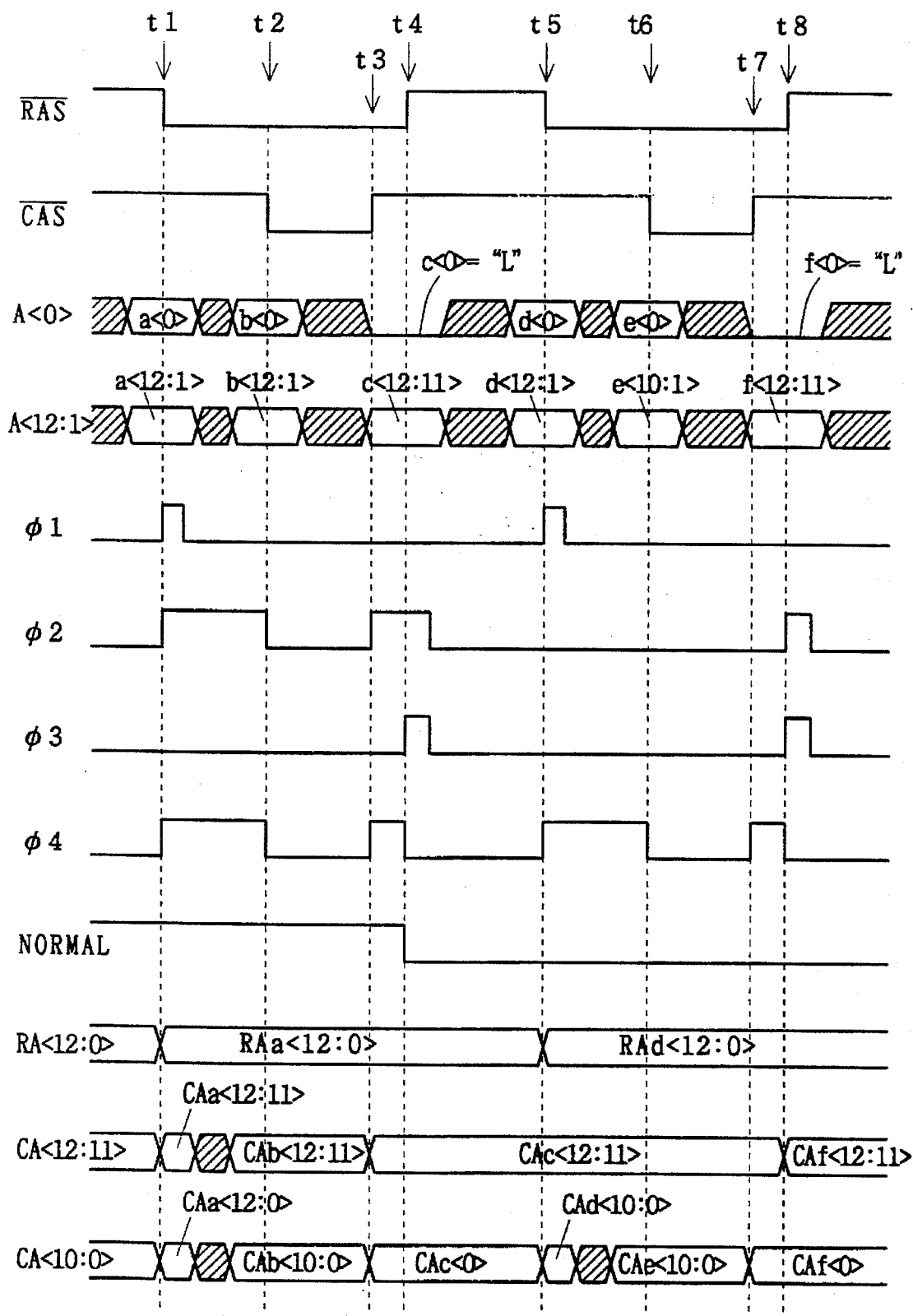

FIG. 4 and FIG. 5 are timing charts for explaining the operation of the first preferred embodiment. Usually, after application of power source $V_{cc}$, a DRAM repeats activation and inactivation of the control signal $\overline{RAS}$ more than eight times for initializing the circuit. Along with inactivation (rise) of the control signal $\overline{RAS}$, the clock signal $\phi3$ is activated (from "L" to "H") repeatedly in a pulse width determined by the delay time of the inverters 57 to 59.

On the other hand, in the address generating unit 114, the NMOS transistor 35 transmits or does not transmit the data given to the address pin A<0> depending on activation or inactivation of the clock signal $\phi3$. The NMOS transistor 35 is connected to the latch formed by the inverters 55, 56, and by activation of the clock signal $\phi3$, the data given to the address pin A<0> is outputted as changeover signal NORMAL through the inverters 55, 57 (FIG. 4).

Accordingly, by given the logic "H" to the address pin A<0> at the time of application of a power source, the signal $\phi3$ becomes "H" and the changeover signal NORMAL becomes "H". During the changeover signal NORMAL at "H", all block selection signals BSx are "H", and in all output units 40x, all sense amplifiers are turned on. In this case, in other words, the DRAM 100 operates the same as the DRAM 200.

Then, referring to FIG. 5, since the changeover signal NORMAL is "H", the clock signal $\phi2$ is "H" when at least either one of the clock signal $\phi3$ and the clock signal $\phi4$ is "H". At time t1, the changeover signal NORMAL is "H" and the clock signal $\phi3$ remains at "L", and hence the clock signal $\phi2$ has the same waveform as the clock signal $\phi4$. The clock signal $\phi4$ is "H" while the control signal $\overline{RAS}$ is "L" and the control signal $\overline{CAS}$ is "H". Thereafter, unless the clock signal $\phi3$ is activated due to inactivation ("H") of the control signal $\overline{RAS}$, the clock signal $\phi2$ continues to have a complementary value to the control signal $\overline{CAS}$.

Updated data a<0> is given to the address pin A<0> where the data "H" for making the changeover signal NORMAL to "H"has been already given before the control signal $\overline{RAS}$ is activated. Data a<12:1> is given to the address pins A<12:1>. Data a<12:0> has the content of a row address RA. They are given by the controller and CPU provided outside of the DRAM as described below.

As the control signal $\overline{RAS}$ is activated at time t1, the clock signal $\phi1$ is set in an active state in the pulse width determined by the delay time of the inverters 57 to 59. Hence, in the address generating unit 112, the NMOS transistor 29 transmits the data a<12:0>, and the data a<12:0> is outputted as a row address RAa<12:0> through the inverters 36, 38.

As a result, the data a<12:0> is given to the row decoder 30x as the row address RAa<12:0>. Since all block selection signals BSx are at "H", all of 8192 sense amplifiers corresponding to the word line $WL_i$ specified by the row address RAa<12:0> are turned on.

Afterwards, while the control signal $\overline{RAS}$ is "L", at time t2, the control signal $\overline{CAS}$ is activated. Before time t2, updated data b<12:0> is given to the address pins A<12:0>, and the data b<12:0> has the content of a column address.

Since the control signal $\overline{CAS}$ was "H" at time t1, until the control signal $\overline{CAS}$ becomes "L" at time t2, the clock signals $\phi2$, $\phi4$ are "H". Hence, if the control signal $\overline{CAS}$ is "L" at time t2, the content of the data b<12:0> is held by the latch formed by the pair of inverters 39, 40, the pair of inverters 45, 46, and the pair of inverters 51, 52. Therefore, the column decoder 2 selects a pair out of 8192 pairs of NMOS transistors according to this address.

While the changeover signal is "H", the operation of the DRAM 100 is the same as that of the conventional art. When the changeover signal becomes "L", the operation of the DRAM 100 is changed to an operation (hereinafter called power-saving operation), where the DRAM reduces the number of the activated sense amplifiers to ¼ to reduce the operating power. The power-saving operation is described in the following.

First, before the control signal $\overline{RAS}$ is inactivated at time t4 (from "L" to "H"), data c<0>="L" is given to the address pin A<0>. In the address pins A<12:11>, data c<12:11> for showing the most significant two bits of a column address is given. The input of such data c<12:11>, c<0> is effected, as mentioned later, by the controller and CPU provided outside the DRAM.

For example, at time t3 when the control signal $\overline{CAS}$ is "H", the control signal RAS is still "L", and at this time, the data C<0>="L" may be given to the address pin A<0>, and the data c<12:11> to the address pins A<12:11 >.

Afterwards, at time t4, when the control signal $\overline{RAS}$ becomes "H", the clock signal $\phi3$ is activated in the pulse width determined by the delay time of the inverters 57 to 59, and the data c<0> is outputted as changeover signal NORMAL. The clock signal $\phi2$ which is "H" before time t3 is still "H" after time t3, and when the data c<12:11> is outputted as a column address CAc<12:11> by the first address generating unit 111.

As the changeover signal NORMAL becomes "L", the block selection signal generating circuit 70 renders only one of the block selection signals BSx "H" according to the column address CAc<12:11>. That is, the highest two bits of the column address function as a block address for specifying the block selection signal BSx. As mentioned above, since the block selection signal BSx is responsible for on/off switching of the functions of the row decoders 30x and the output units 40x, only 2048 sense amplifiers of the output units 40x corresponding to one of the block signal selection signals BSx becoming "H" are turned on. Hence, as compared with the conventional DRAM 200, reduction of power is realized. Only the corresponding row decoder 30x selects the word line $WL_i$ according to the row address specified later.

Incidentally, the changeover signal NORMAL becomes "L", and the clock signal φ2 has the same waveform as the clock signal φ3.

Afterwards, before the control signal $\overline{\text{RAS}}$ is activated at time t5 again, data d<12:0> is given as row address to the address pins A<12:0>. When the control signal RAS becomes "L" at time t5, the clock signal φ1 becomes "H" for a specific time. The clock signal φ4 comes to have the same logic as the control signal $\overline{\text{CAS}}$. Therefore, the data d<12:0> is outputted as a row address RAd<12:0> by the address generating unit 112.

Thus, although the row address RAd<12:0> outputted from the address generating unit 112 is given to all row decoders 30a, 30b, 30c, 30d, only one of the row decoders has been turned on before. Therefore, the length of the specified word line $WL_i$ is ¼ as compared with the conventional art.

Then, before the control signal $\overline{\text{CAS}}$ is activated at time t6, data e<10:0> is given to the address pins A<10:0> as a column address. The highest two bits in the column address have been already given as the block address (data c<12:11>), and herein the lower 11 bits in the column address are inputted.

Since the control signal $\overline{\text{CAS}}$ has been "H" before time t6, the clock signal φ4 is "H", and the data e<10:0> is outputted as a column address CAe<10:0> by the address generating unit 113.

The column address CAe<10:0> outputted thus from the address generating unit 113 is given to the column decoder 2. Already the block address CAc<12:11> has been given to the column decoder 2, only the transistors 7x, 8x corresponding to one of the 2048 sense amplifiers being turned on are made to conduct, and the contents of the sense amplifiers are transmitted to the I/O lines and $\overline{\text{I/O}}$ lines.

Figure 19:
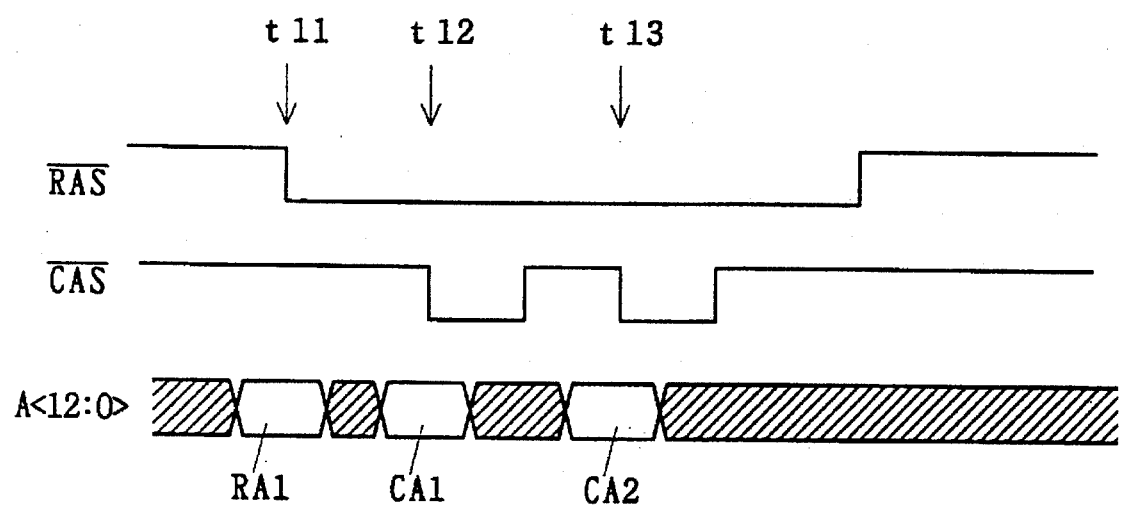
FIG. 19 is a timing chart showing the conventional art.

In the case that the memory cell desired to be selected next is contained in the memory cell 6x to which the presently selected memory cell belongs (page hit), as shown in FIG. 19, the control signal $\overline{\text{CAS}}$ is once inactivated, while activating the control signal RAS, and by activating it again later, the lower 11 bits of the column address are successively given to the column decoder 2.

In the case that the memory cell desired to be selected next is contained in the memory cell 6x difference from the one to which the presently selected memory cell belongs (page fault), the control signal $\overline{\text{CAS}}$ and the control signal $\overline{\text{RAS}}$ are respectively inactivated, and then the block address must be read again.

FIG. 5 shows a page fault case after time t6. Before the control signal $\overline{\text{RAS}}$ is inactivated at time t8, data f<0>="L" is given to the address pin A<0>. In the address pins A<12:11>, data f<12:11> showing the highest two bits (block address) of the column address is given. At time t7, when the control signal $\overline{\text{CAS}}$ becomes "H", the control signal $\overline{\text{RAS}}$ is still "L", and hence the clock signal φ2 remains at "L". Furthermore, at time t8, the control signal $\overline{\text{RAS}}$ becomes "H", the clock signal φ2 becomes "H" together with clock signal φ3, and the data f<12:11> is outputted as a block address CAf<12:11> by the address generating unit 111.

Hereinafter, specification of the row address, and specification of the lower 11 bits of the column address are done the same as after time t4.

As understood herein, the block address is obtained at the timing of inactivation of control signal $\overline{\text{RAS}}$. Hence, without increasing the number of address pins or without increasing the control signals, the block address can be determined ahead of the row address.

As known from the operation above, in the preferred embodiment, the block address is obtained, as a rule, at the timing of inactivation of the control signal $\overline{\text{RAS}}$.

Therefore, in the power-saving operation, in order that the row address and column address for specifying the memory cell be decoded, after inputting the block address at time t4, the time is required up to time t6 when all is decoded by the column decoder 2 including the remaining lower 11 bits of the column address by the control signal $\overline{\text{CAS}}$. In an ordinary operation, on the other hand, the row address is inputted at time t1, and the whole column address is decoded by the column decoder 2 at time t2. Therefore, the time necessary for specifying the memory cell in the power-saving operation is longer than the time required for specifying the memory cell in the ordinary operation.

In the power-saving operation, however, such an operation is needed only in the case of a page fault, and considering that the precharging period is necessary in the ordinary operation in the case of a page fault, in the power-saving operation, the performance as the system utilizing the DRAM may be said to be hardly lowered as compared with the case of the ordinary operation.

Figure 6:
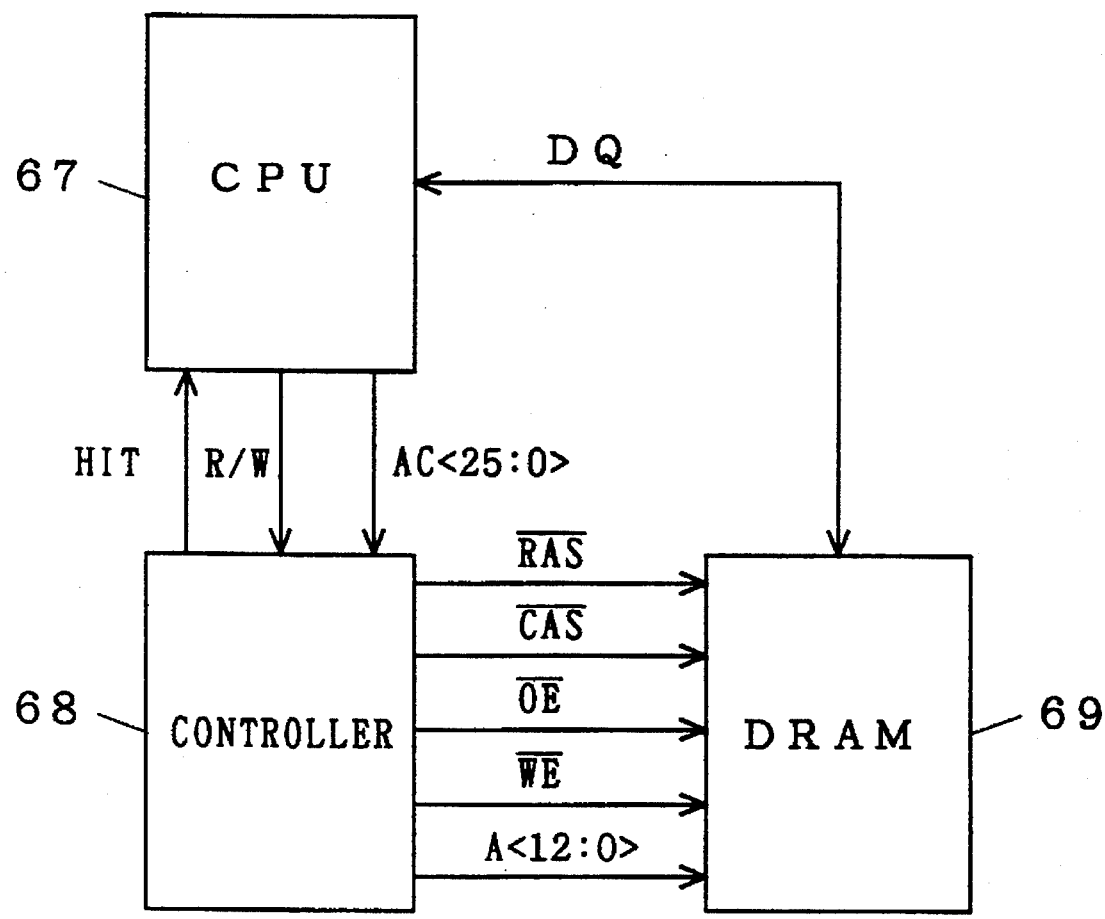
FIG. 6 is a block diagram for explaining the operation of the first preferred embodiment of the invention.

FIG. 6 is a block diagram showing an example of a constitution of a computer 300 using the DRAM as a memory element.

The computer 300 comprises a CPU (central processing unit) 67, a controller 68, and a DRAM 69. The CPU 67 generates address signal AC<25:0> and read/write command R/W. The controller 68 gives data to the address pins A<12:0> of the DRAM 69 according to the address signal AC<25:0>, and also generates control signals $\overline{\text{RAS}}$, $\overline{\text{CAS}}$, $\overline{\text{OE}}$, $\overline{\text{WE}}$ according also to the read/write command R/W.

Figure 7:
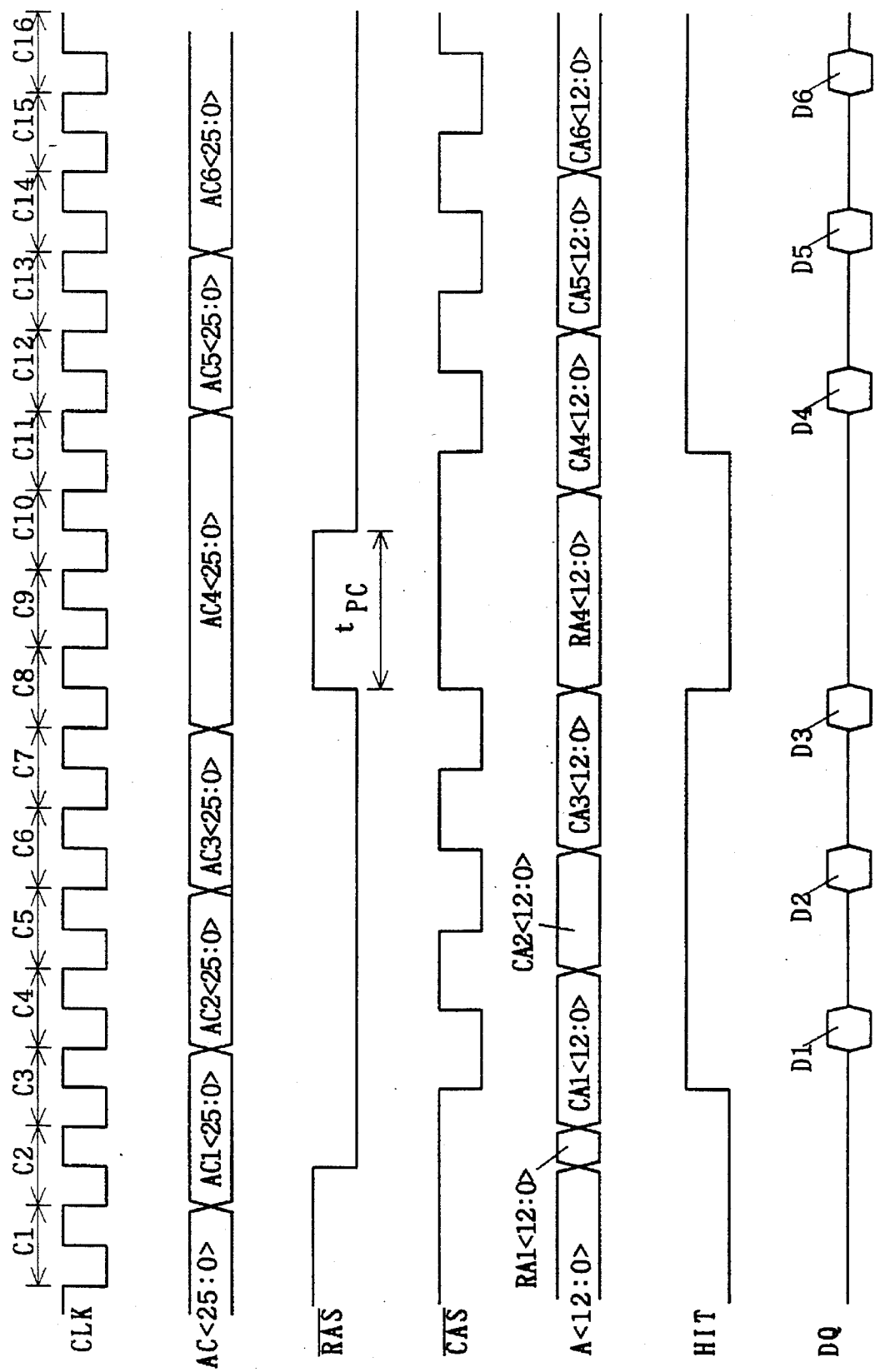
FIGS. 7 and 8 are timing charts for explaining the operation of the first preferred embodiment of the invention.
Figure 8:
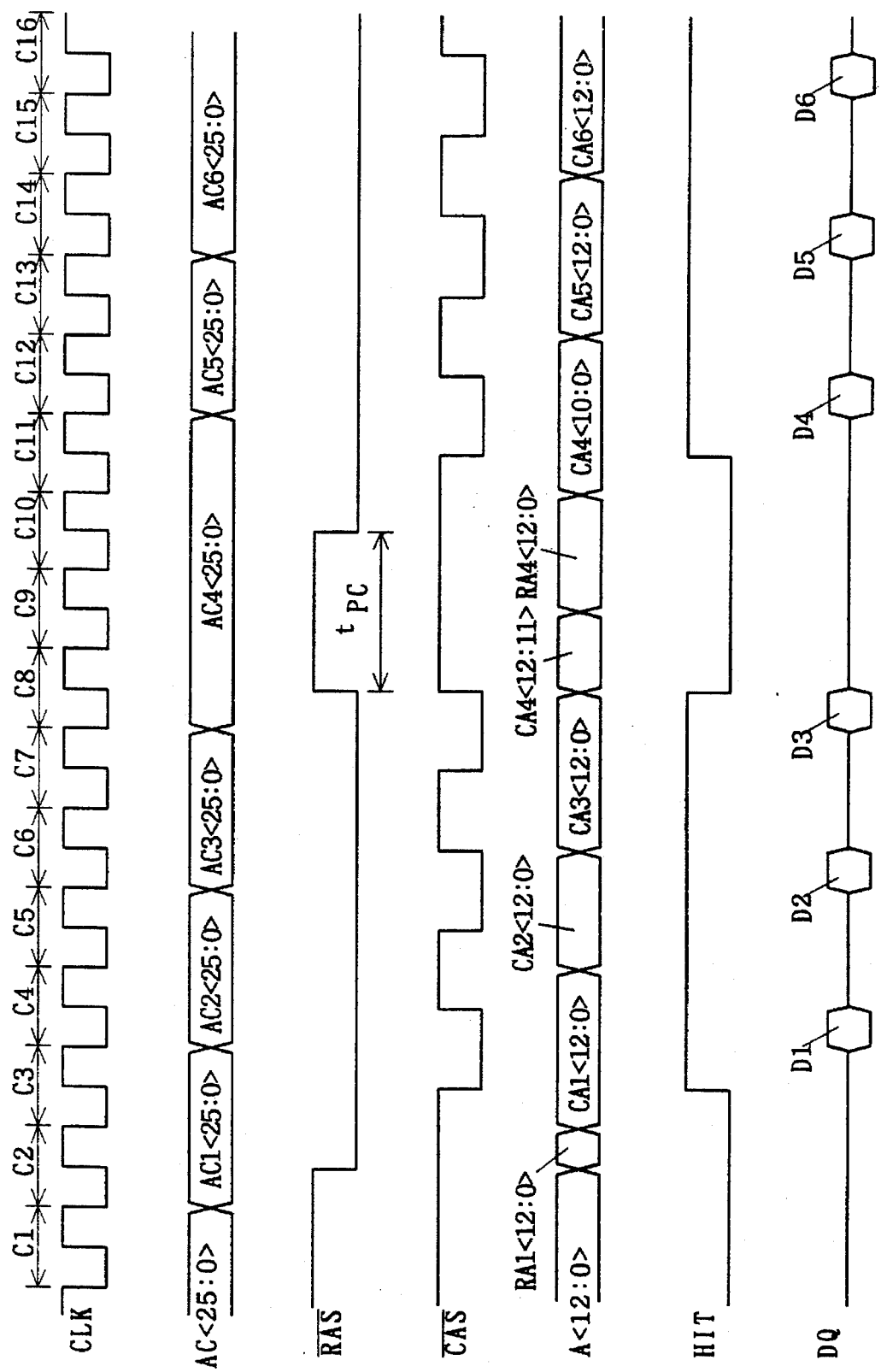

FIG. 7 and FIG. 8 are timing charts showing the operation of the computer 300 when using the conventional DRAM 200 and the DRAM 100 in the preferred embodiment as the DRAM 69, respectively. The controller 68 operates according to the clock signal CLK.

In FIG. 7, upon start of cycle C2 (fall of clock signal CLK), when the CPU 67 generates an address signal AC1<25:0>, the controller 68 renders the control signal $\overline{\text{RAS}}$ "L" in the middle of the cycle C2 (rise of clock signal CLK), and applies a part of the address signal AC1<25:13> as a row address RA1<12:0> to the DRAM 200. Consequently, upon start of cycle C3, the other part of the address signal AC1<12:0> is applied as column address CA<12:0> to the DRAM 200, and in the middle of the cycle C3, the control signal $\overline{\text{CAS}}$ is rendered to "L" and applied thereto. At this time, the hit signal HIT showing page hit becomes "H". The DRAM 200 outputs the data D1 selected by the applied row address RA1<12:0> and row address CA1<12:0>.

Upon start of cycle C4, the CPU 67 generates address signal AC2<25:0>. When parts of the address signal AC2<25:13> and AC1<25:13> are equal to each other (page hit), the row addresses are same, and hence the controller 68 once inactivates the control signal $\overline{\text{CAS}}$ in the middle of the cycle C4, without inactivating the control signal $\overline{\text{RAS}}$.

Upon start of cycle C5, the controller 68 gives the part of address signal AC2<12:0> to the address pins A<12:0> of the DRAM 200 as a column address CA2<12:0>. In the middle of the cycle C5, the control signal $\overline{\text{CAS}}$ is activated. The DRAM 200 outputs the data D2 selected by the row address RA2<12:0> (=RA1<12:0>) and the column address CA2<12:0>. Being in the state of page hit, the hit signal HIT remains at "H".

Similarly, the controller 68 gives a part of an address signal AC3<12:0> to the address pins A<12:0> of the DRAM 200 as a column address CA3<12:0>, and once inactivates the control signal $\overline{CAS}$, and then activates it again. As a result, the DRAM 200 outputs the data D3 selected by the row address RA3<12:0> (=RA1<12:0>) and the column address CA3<12:0>. Being in the state of page hit, the hit signal HIT remains at "H" (cycles C6, C7).

Upon start of cycle C8, the CPU 67 generates an address signal AC4<25:0>, causing AC4<25:13> ≠AC3<25:13>, in the event of page fault, the control signal RAS is once inactivated, and it is necessary to inactivate the word lines and initialize the sense amplifiers.

For initialization sense amplifiers, precharging is necessary, and precharging requires a precharge time $t_{pc}$. Therefore, in the event of page fault, the controller 68 renders the hit signal HIT "L", and instructs to delay the occurrence of next address signal AC5<25:0> to the CPU 67 (middle of cycle C8).

The precharge time $t_{pc}$ requires at least the portion of two cycles of the clock signal CLK, which is hence terminated only in cycle C10. After the passing of the precharge time $t_{pc}$, the controller 68 activates the control signal $\overline{RAS}$. At this moment, a part of the address signal AC4<25:13> is already given to the DRAM 200 as a row address RA4<12:0> to the address pins A<12:0>, and hence the row address is specified in the DRAM 200.

Consequently, upon start of cycle C11, the controller 68 gives the other part of the address signal AC4<12:0> to the address pins A<12:0> as the column address CA4<12:0>. The DRAM 200 outputs the data D4 according to the row address RA4<12:0> and column address CA4<12:0>.

In cycle C12 and cycle C14, the CPU 67 respectively generates address signals AC5<25:0>, AC6<25:0>. Herein, the relation is AC4<25:13>=AC5<25:13>=AC6<25:13>, that is, page hit, and the same operation as in cycles C4 to C7 is effected.

On the other hand, in FIG. 8 corresponding to the preferred embodiment, the DRAM 100 is supposed to be first set in ordinary operation (NORMAL="H"). Therefore, the operation in cycle C1 to C7 is the same as shown in FIG. 7 corresponding to the conventional art.

In the event of page fault in cycle 8, the controller 68 gives "L" to the address pin A<0>, and instructs to transfer to power-saving operation from the next cycle. In the middle of cycle C8, the control signals $\overline{RAS}$ and $\overline{CAS}$ are inactivated, which is the same as in FIG. 7. By setting the control signal $\overline{RAS}$ to "H", a part of the address signal AC4<12:11> is given to the address pins A<12:11> as a block address CA4<12:11>. The precharge time $t_{pc}$ starts, and the hit signal HIT becomes "L". This moment corresponds to time t4 in FIG. 5.

During the precharge time $t_{pc}$, the controller 68 gives the other part of the address signal AC4<25:13> to the address pins A<12:0> as the row address RA4<12:0>. After the lapse of precharge time $t_{pc}$, the controller 68 sets the control signal $\overline{RAS}$ to "L", and the row address RA4<12:0> is transmitted to the DRAM 100. This moment corresponds to time t5 in FIG. 5.

Upon start of cycle C11, another part of the address signal CA4<10:0> is given to the address pins A<10:0> as the column address CA4<10:0>. In the middle of the cycle C11 (this moment corresponds to time 16 in FIG. 5), the control signal $\overline{CAS}$ becomes "L". The DRAM 100 outputs data D4 according to the inputted row address RA4<12:0> and column address CA4<12:0>.

After cycle C12, it is the case of page hit, and the operation is the same as shown in FIG. 7.

Thus, the block address is specified during the precharge time $t_{pc}$ and hence the output timing of the data D1 to D5 from the DRAM is the same. Hence, in the preferred embodiment, there is no deterioration of processing speed in the computer 300 by employing the DRAM 100, so that low power consumption may be realized.

Figure 9:
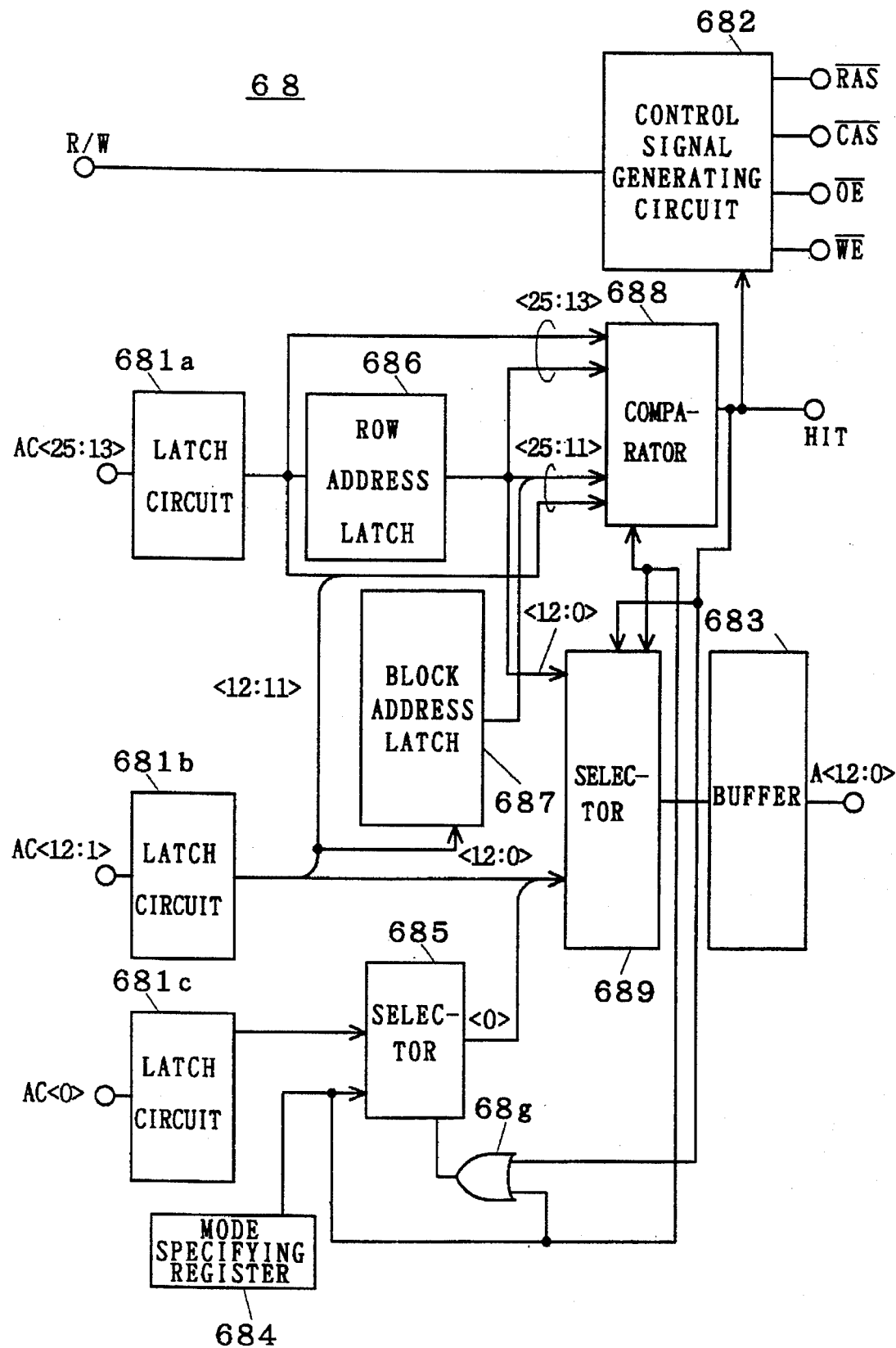
FIG. 9 is a block diagram for explaining the operation of the first preferred embodiment of the invention.

FIG. 9 is a block diagram showing an example of a structure of the controller 68. The controller 68 comprises latch circuits 681a to 681c for inputting by distributing the address signal AC<25:0> given from the CPU 67, and a control signal generating unit 682 for generating control signals $\overline{RAS}$, $\overline{CAS}$, $\overline{OE}$, $\overline{WE}$ on the basis of the read/write command R/W.

The latch circuits 681a, 681b, 681c respectively latch parts of the address signals AC<25:13>, AC<12:1>, AC<0>.

The latch circuit 681c is connected to one input end of a selector 685, and the content of a mode specifying register 684 is given to the other input end of the selector 685. Which one of the data given to the two input ends is outputted to the output end of the selector 685 is controlled by the output of an OR gate 68g. The mode specifying register 684 gives "1" and "0" in ordinary operation and power-saving operation, respectively, to the other input end of the selector 685 and one input end of the OR gate 68g. At the other input end of the OR gate 68g, a hit signal HIT is given. In ordinary operation, the output of the OR gate 68g is "H" regardless of the value of the hit signal HIT, and the selector 685 outputs the content of the latch circuit 681c.

A row address latch 686 latches the output of the latch circuit 681a, and transmits it to a comparator 688 and one input end of a selector 689. A block address latch 687 latches an upper two bits of the latch circuit 681b, and transmits the content thereof to the comparator 688 crowned with 13 bits outputted by the line address latch 686.

The upper two bits of the content of the latch circuit 681b are transmitted to the comparator 688 crowned with 13 bits outputted by the latch circuit 681a.

At the other input end of the selector 689, the output of the selector 685 crowned with the output of the latch circuit 681b is given.

In ordinary operation, the mode specifying register 684 is held at "1". The comparator 688 compares the upper 13 bits with each other as the content of the mode specifying register 684 is "1".

The row address latch 686 is latching the row address being accessed at the present. On the other hand, the latch circuit 681a is latching the row address to be accessed next. When both are matched, it is the page hit state, and if different, it is a page fault stage.

In the case of page hit, the comparator 688 makes the hit signal HIT "H". In response, the selector 689 transmits 13 bits composed of the output of the latch circuit 681b and the output of the latch circuit 681c given from the selector 685 to the buffer 683 as a column address CA<12:0>. The control signal generating unit 682 makes the control signal $\overline{CAS}$ "L". This operation corresponds to the operation at time t12 in FIG. 19.

In the case of page fault, the comparator 688 makes the hit signal HIT "L". The control signal generating unit 682 makes the control signal $\overline{RAS}$ "H". The row address latch 686 latches the row address to be accessed next that is given to the latch circuit 681a. The selector 689 selects the output of the row address latch 686, and transmits it to the buffer 683 as a row address RA<12:0>. Furthermore, after a specific time, the control signal generating unit 682 makes the control signal $\overline{RAS}$ "L". This operation corresponds to the operation at time t1 in FIG. 5.

Further after a specific time, the selector 685 selects one bit being held in the latch circuit 681c, and gives it to the selector 689. At this time, the output of the latch circuit 681b has been also given, and a part of the address signal AC<12:0> is given to the buffer 683 as column address. Then the control signal generating unit 682 makes the control signal $\overline{CAS}$ "L". This operation corresponds to the operation at time t2 in FIG. 5.

In the case of power-saving operation, the content of the mode specifying register 684 is 0, and the comparator 688 compares 15 bits having the output of the block address latch 687 crowned with the output of the row address latch 686, and 15 bits having upper two bits of the latch circuit 681b crowned with the output of the latch circuit 681a. The former 15 bits correspond to the page being accessed at the present, and the latter 15 bits correspond to a new page to be accessed.

In the case of page hit, the comparator 688 makes the hit signal HIT "H", and the output of the OR gate 68g becomes "H". As a result, the selector 685 gives the content of the latch circuit 681c to the selector 689 together with the content of the latch circuit 681b. Since the hit signal is "H", the selector 689 gives the contents of the latch circuits 681b, 681c, not the output of the row address latch 686, to the buffer 683 as column address. This operation is the same as in ordinary operation.

In the case of page fault, the hit signal HIT is made to "L" by the comparator 688, and the content of the mode specifying register 684 is also "L" ("0"), and hence the output of the OR gate 68g is also "L". Hence, the selector 685 gives the content "L" of the mode specifying register 684 to the selector 689 together with the output of the latch circuit 681b. Since the hit signal HIT is given as "L" to the selector 689, these contents are given to the buffer 683. On the other hand, the control signal generating circuit 682 makes the control signal $\overline{RAS}$ "H". This operation corresponds to the operation at time t4, t8 in FIG. 5. Consequently, not only the block address two bits and one bit of changeover signal, but also the part of the address signal AC<10:1> are also given to the address pins A<10:1> of DRAM 100 as part of column address, but it does not cause inconvenience because the column address CA<10:1> is updated later.

The selector 689 then selects the output of the line address latch 686, and transmits it to the buffer 683. The control signal generating unit 10 makes the control signal $\overline{RAS}$ "L". This operation corresponds to the operation at time t5 in FIG. 5.

Later, moreover, the selector 689 selects again the content of the latch circuits 681b, 681c, and they are given together to the buffer 683 as the lower 13 bits of the column address. That is, the column address is updated. The control signal generating unit 682 makes the control signal $\overline{CAS}$ "L". This operation corresponds to the operation at time t6 in FIG. 5.

In this preferred embodiment, the ordinary operation and power-saving operation are changed over by the changeover signal NORMAL, but when the power-saving operation is always performed, the changeover signal NORMAL may be always "L", and the address generating unit 114 is not needed. Besides, since the clock signal φ2 is identical with the clock signal φ3, the clock signal φ3 may be given instead of the clock signal φ2 in the address generating unit 111, and hence the clock signal generating unit 17 could not be needed.

Further, in FIG. 5, only the block address is given prior to the row address, but, in addition to the block address, other bits of the column address may be also given prior to the row address. For example, at time t3, aside from data c<0> (="L"), c<12:11>, data c<10:0>corresponding to the third to the thirteenth bits from the top of the column address may be also given to the address pins A<12:0>. Since it is not necessary to give "L" to the address pin A<0>for generating the changeover signal NORMAL, it is not necessary to update the least significant bit CA<0> of the column address especially after the row address.

In this case, therefore, the address generating unit 113 is also unnecessary, and the address generating unit 111 is responsible for transmission of the data given to the address pins A<12:0>. In this case, the whole column address is given prior to the row address. When the column address is given at such timing, the block address composed of the highest two bits thereof can select the output unit 40x prior to selection of the word line $WL_i$, and the column decoder 2 can decode the column address at the timing of activating the control signal $\overline{CAS}$.

According to the first preferred embodiment, in the semiconductor memory device comprising 64M of memory cells and 13 address pins, 2048 ($=2^{26}/2^{25}=2^{11}$) memory cells, which is decoded by 15 bits, a sum total of 2 bits inputted when /RAS becomes "H" and 13 bits inputted when /RAS becomes "L", are selected.

Second Preferred Embodiment

A synchronous DRAM differs from the standard DRAM in the address input method, and the invention can be also applied to the synchronous DRAM the same as in the first preferred embodiment.

Figure 10:
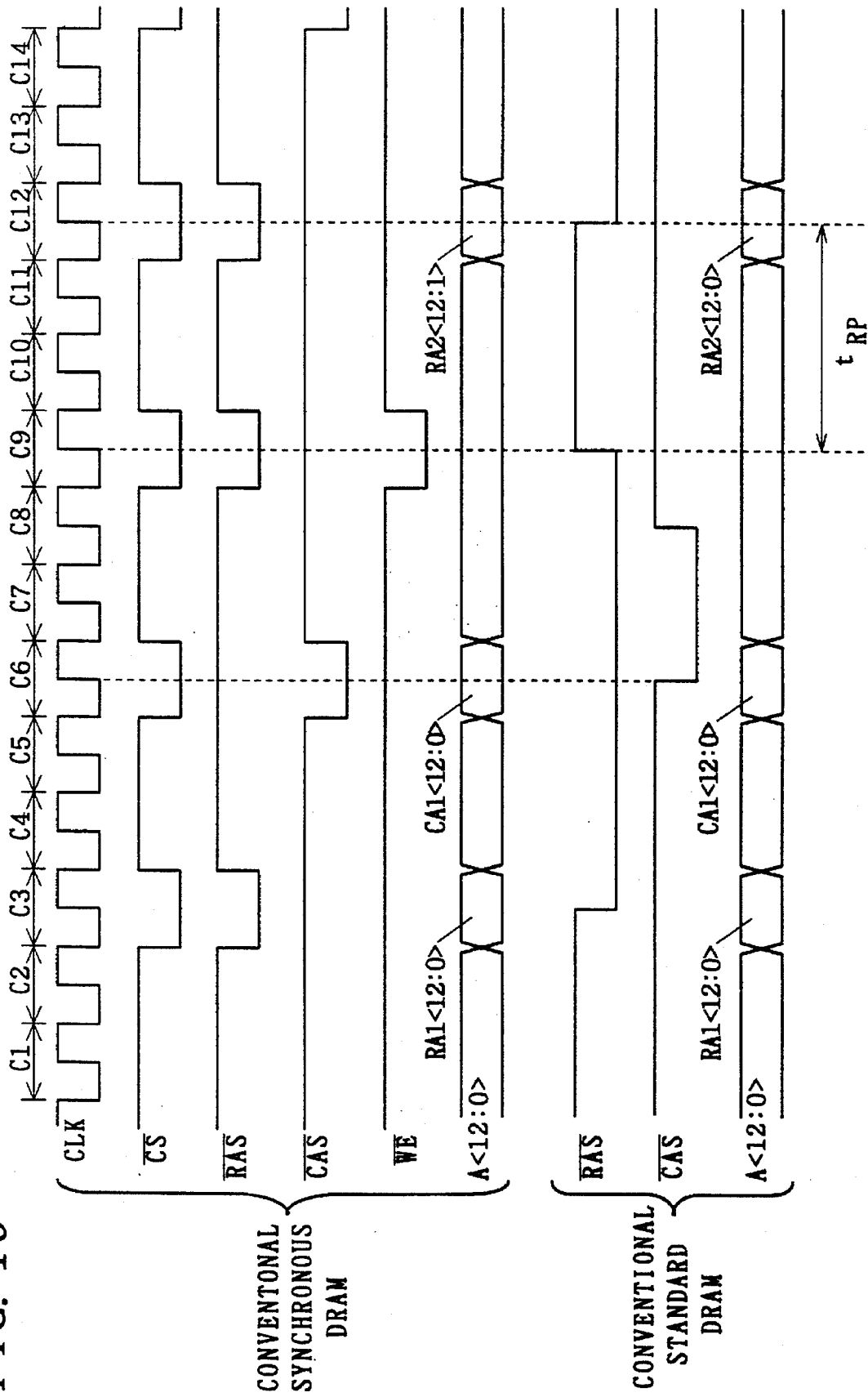
FIG. 10 is a timing chart for explaining the operation of a conventional synchronous DRAM.

FIG. 10 is a timing chart for explaining the operation of a conventional synchronous DRAM in comparison with the operation of a conventional ordinary (standard) DRAM.

In the conventional synchronous DRAM, the row address RA1<12:0> is taken in at the timing when the clock signal CLK rises to "H" in the cycle when the control signals $\overline{CS}$, $\overline{RAS}$ are "L" and control signal $\overline{WE}$ is "H" (cycle C3). It corresponds to the case of signal $\overline{RAS}$ falling to "L" in the conventional standard DRAM.

The column address CA1<12:0> is taken in at the timing when the clock signal CLK rises to "H" in the cycle when the control signals $\overline{CS}, \overline{RAS}$ are "L" and control signal $\overline{WE}$ is "H"(cycle C6). It corresponds to the case of signal $\overline{CAS}$ falling to "L" in the conventional standard DRAM.

In the case of access to memory cells of different lines, inactivation of word line and initialization of sense amplifiers are started at the timing when the control signals $\overline{CS}$, $\overline{RAS}$, $\overline{WE}$ are "L" and the clock signal CK rises to "H"(cycle C9). This corresponds to the case of the signal $\overline{RAS}$ rising to "H"in the conventional standard DRAM.

Figure 11:
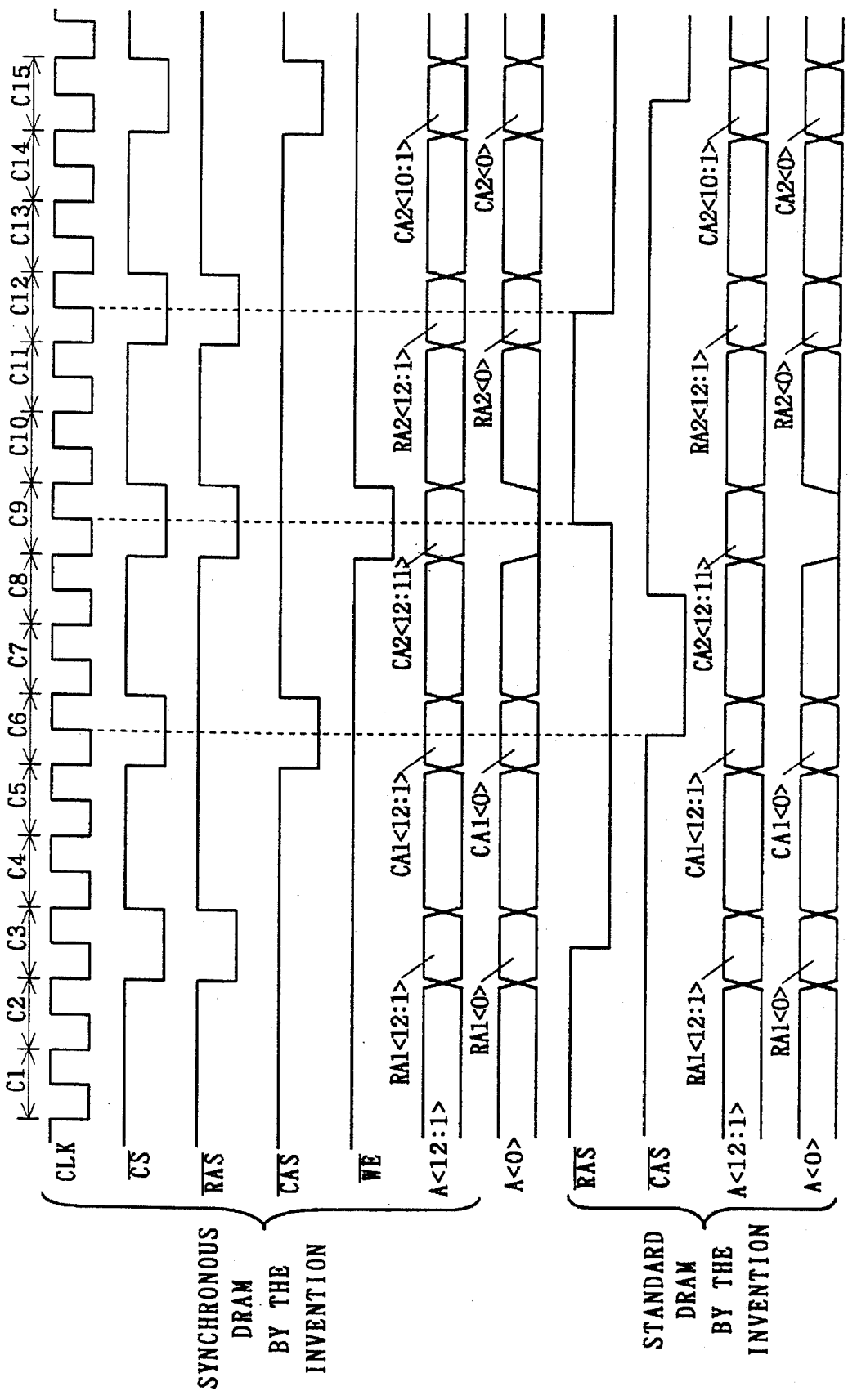
FIG. 11 is a timing chart for explaining the operation of a second preferred embodiment of the invention.

After precharge time ($t_{RP}$,), a row address RA2 is applied same as the row address RA1<12:0> (cycle C12). FIG. 11 is a timing chart showing the operation of the invention applied to the synchronous DRAM in comparison with the operation of the invention applied to the standard DRAM.

The synchronous DRAM is supposed to be first in ordinary operation. Therefore, the operation from cycles C1 to C8 is same as shown in FIG. 10.

Next is assumed a case of accessing a memory cell in a different line by a power-saving operation. In cycle C9, "L" is given to the address pin A<0>, and a block address is applied to the address pins A<12:11>, the control signals $\overline{CS}$, $\overline{RAS}$, $\overline{WE}$ are set to "L", and start of inactivation of word lines and initialization of sense amplifiers is instructed, and the next access operation is specified to be a power-saving operation.

In cycle C12, afterwards, a row address RA2<12:0> is applied to the address pins A<12:0>, the control signals $\overline{CS}$ and $\overline{RAS}$ are set to "L", and the row address is read in. Moreover, in cycle C15, the remaining column address CA2<10:0> is given, and the control signals $\overline{CS}$ and $\overline{CAS}$ are set to "L" and the column address is decoded.

In this way, in the synchronous DRAM, the operation is similar to that of the ordinary DRAM except that only the operation of control signals is slightly different. To operate in ordinary mode after cycle C9, the signal A<0> is set to "H" in cycle C9, the same as in the first preferred embodiment.

According to the second preferred embodiment, in the semiconductor memory device comprising 64M of memory cells and 13 address pins, 2048 ($=2^{26}/2^{15}=2^{11}$) memory cells, which is decoded by 15 bits, a sum total of 2 bits inputted when /RAS becomes "H" and 13 bits inputted when /RAS becomes "L", are selected.

Third Preferred Embodiment

Figure 12:
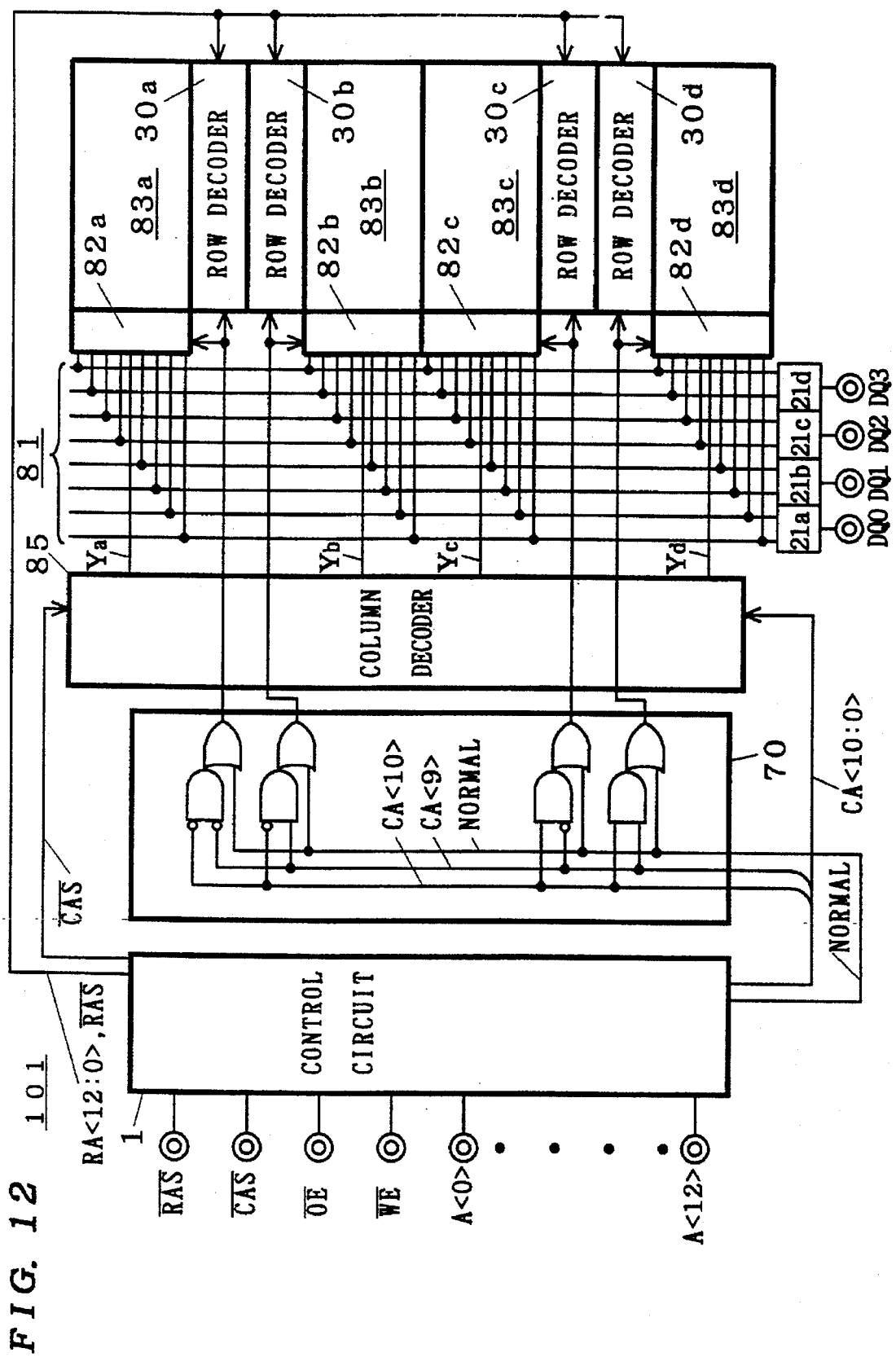

The invention may be also applied to a DRAM of a type of reading out information of plural memory cells simultaneously by specifying one type of address. FIG. 12 is a block diagram showing an example of the constitution of a DRAM 101. The DRAM 101 has 64M memory cells, comprising 16M words×4 bits, in which by specifying one address, the contents of four adjacent memory cells are read out.

Same as the DRAM 100 shown in FIG. 1, the DRAM 101 comprises a control circuit 1 and a block selection signal generating circuit 70. Instead of the blocks 6a to 6d in the DRAM 100, blocks 83a to 83d are provided, and they have word lines selected by the row address decoded by row decoders 30a to 30d.

However, instead of the column decoder 2 and output units 40a to 40d in the DRAM 100, the DRAM 101 comprises a column decoder 85 and output units 82a to 82d. This is because the DRAM 100 requires column address of 13 bits for specification of column direction and reads out from one memory cell specified by the word line and column direction, whereas the DRAM 101 requires column address of 11 bits for specification of column direction and reads out simultaneously from four memory cells specified by the word line and column direction. The column decoder 85 receives column address CA<10:0> from the control circuit 1.

Since the column direction is thus specified, in this preferred embodiment, the block selection signal generating circuit 70 is not provided with column address CA<12:11> as in the DRAM 100, but is provided with column address CA<10:9>. That is, the block address corresponds to the column address CA<10:9>.

Figure 13:
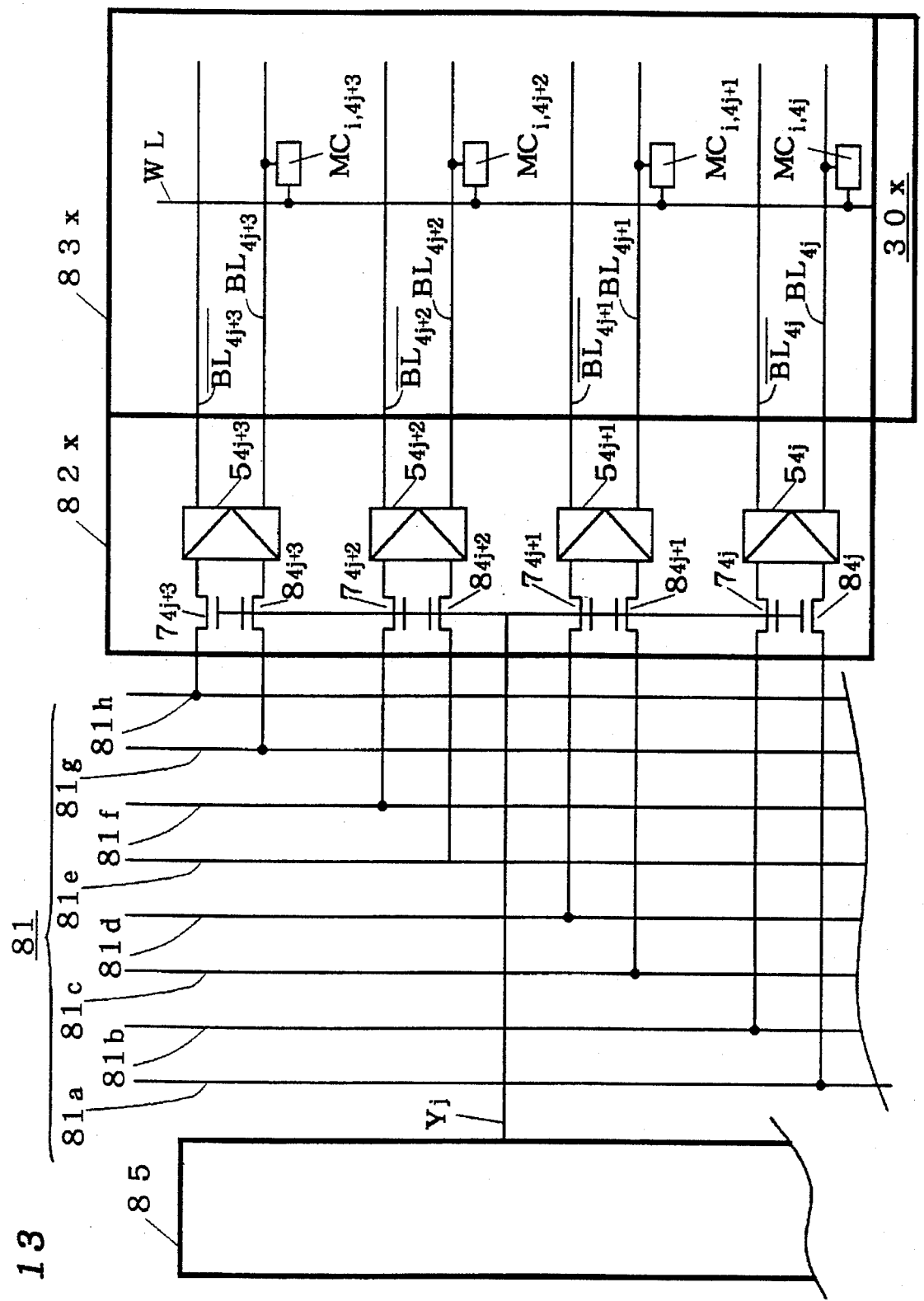

FIG. 13 is a circuit diagram showing the detail near a certain block 83x. The block 83x has word lines $WL_i$ (i=0 to 8191), and they are specified by the row decoder 30x.

Four memory cells are read out simultaneously, and hence four I/O lines 81a, 81c, 81e, 81g, and corresponding four $\overline{I/O}$ lines 81b, 81d, 81f, 81h are provided. The I/O lines 81a, 81c, 81e, 81g, and $\overline{I/O}$ lines 81b, 81d, 81f, 81h compose an I/O line group 81.

The I/O line 81a and $\overline{I/O}$ line 81b are given to the input/output buffer 21a, the I/O line 81c and $\overline{I/O}$ line 81d are given to the input/output buffer 21b, the I/O line 81e and $\overline{I/O}$ line 81f are given to the input/output buffer 21c, and the I/O line 81g and $\overline{I/O}$ line 81h are given to the input/output buffer 21d. Each input/output buffer possesses the function of the read circuit 23 and the function of write circuit 24 of the DRAM 100. The input/output buffers 21a to 21d are connected to the data input and output terminals DQ0 to DQ3, and the write data and read data are present in these data input and output terminals.

The output units 82x are provided in correspondence to the column direction of the blocks 83x. The column direction is specified by 11 bits as mentioned above. The column selection line group Y comprises $2^{11}/4=512$ lines per block. The memory cell $MC_{i,k}$ is connected to the column selection line $Y_j$ (j=0 to 2047) and bit line $BL_k$ (k=0 to 8191).

The output unit 82x has a set of four sense amplifier groups $5_{4j}$, $5_{4j+1}$, $5_{4j+2}$, $5_{4j+3}$, corresponding to the column selection line $Y_j$. A pair of outputs of the sense amplifier $5_{4j}$ are given to the I/O line 81a and $\overline{I/O}$ line 81b through NMOS transistors $7_{4j}$, $8_{4j}$. Similarly, a pair of outputs of the sense amplifier $5_{4j+1}$ are given to the I/O line 81c and $\overline{I/O}$ line 81d through NMOS transistors $7_{4j+1}$, $8_{4j+1}$, a pair of outputs of the sense amplifier $5_{4j+2}$ are given to the I/O line 81e and $\overline{I/O}$ line 81f through NMOS transistors $7_{4j+2}$, $8_{4j+2}$, and a pair of outputs of the sense amplifier $5_{4j+3}$ are given to the I/O line 81g and $\overline{I/O}$ line 81h through NMOS transistors $7_{4j+3}$, $8_{4j+3}$.

When one column selection line $Y_j$ is selected by the column address of 11 bits, correspondingly, the data given to the bit lines $BL_{4j}$, $BL_{4j+1}$, $BL_{4j+2}$, $BL_{4j+3}$, and inverted bit lines $\overline{BL}_{4j}$, $\overline{BL}_{4j+1}$, $\overline{BL}_{4j+2}$, $\overline{BL}_{4j+3}$, that is, the contents stored in the memory cells $MC_{4j}$, $MC_{4j+1}$, $MC_{4j+2}$, $MC_{4j+3}$ are given to the I/O line group 81.

FIG. 14 is a circuit diagram showing an example of a constitution of the address generating circuit 11 contained in the control circuit 1 in the preferred embodiment. The address generating circuit 11 comprises address generating units 112 to 114, and does not require the address generating unit 111 as compared with the address generating circuit 11 shown in FIG. 2 in the first preferred embodiment.

The data given to the address generating unit 112 is the same as in the first preferred embodiment, but in the address generating unit 113, instead of the clock signal $\phi 4$ given in the first preferred embodiment, a clock signal $\phi 5$ is given. The NMOS transistor 35 of the address generating unit 114 was connected to the address pin A<0> in the first preferred embodiment, but is connected to the address pin A<12> herein. That is, the changeover signal NORMAL for changing over the ordinary operation and power-saving operation is based on the data given to the address pin A<12> in the third preferred embodiment.

Figure 15:
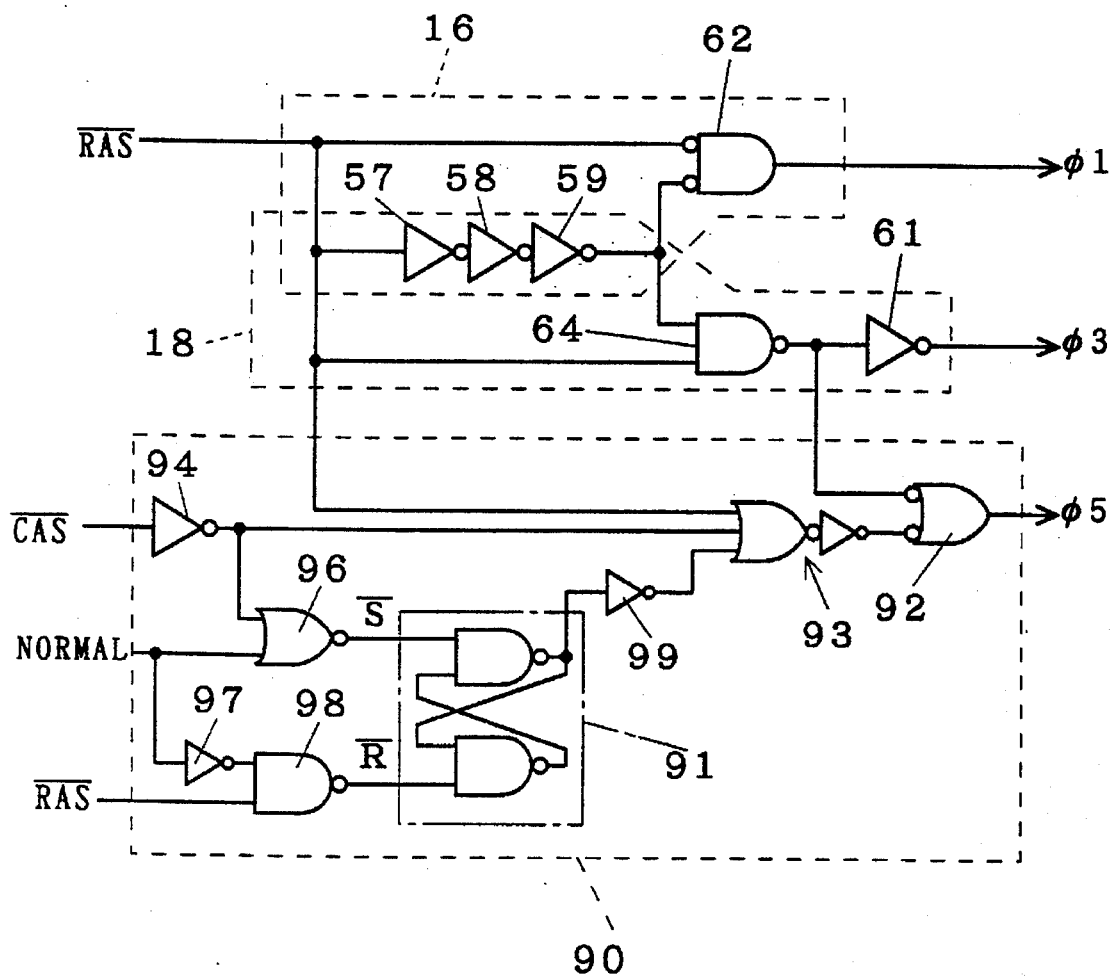

FIG. 15 is a circuit diagram showing an example of a constitution of the clock signal generating circuit 15 in the preferred embodiment. The clock signal generating circuit 15 is provided in the control circuit 1. Same as in the first preferred embodiment, the clock signal generating circuit 15 has clock signal generating units 16, 18, from which the clock signals $\phi 1$, $\phi 3$ are generated respectively. Unlike the first preferred embodiment, however, clock signal generating units 17, 19 are not provided. Instead, a clock signal generating unit 90 is provided, from which the clock signal $\phi 5$ is generated.

The clock signal generating unit 90 receives changeover signal NORMAL and control signals $\overline{RAS}$, $\overline{CAS}$. The control signal $\overline{CAS}$ is inverted in logic by an inverter 94, and is given to a three-input OR gate 93. The output of the inverter 94 is given to one input end of a two-input NOR gate 96. In the other input end of the NOR gate 96, the changeover signal NORMAL is given, and the output of the NOR gate 96 is given as a set input $\overline{S}$ of a flip-flop 91.

The changeover signal NORMAL is inverted in logic by an inverter 97, and is given to one input end of a two-input NAND gate 98. In the other input end of the NAND gate 98, a control signal $\overline{RAS}$ is given, and the output of the NAND gate 98 is given as a reset input $\overline{R}$ of the flip-flop 91.

The output of the flip-flop 91 is inverted by an inverter 99, and is given to the OR gate 93. The OR gate 93 calculates the logical sum of the logical inversion of the control signal $\overline{RAS}$, control signal $\overline{CAS}$ and output of the inverter 99, and outputs. The NAND gate 92 calculates the logical multiplication of the output of the OR gate 93 and logical inversion of clock signal $\phi 3$, and outputs its logical inversion as the clock signal $\phi 5$.

Figure 16:
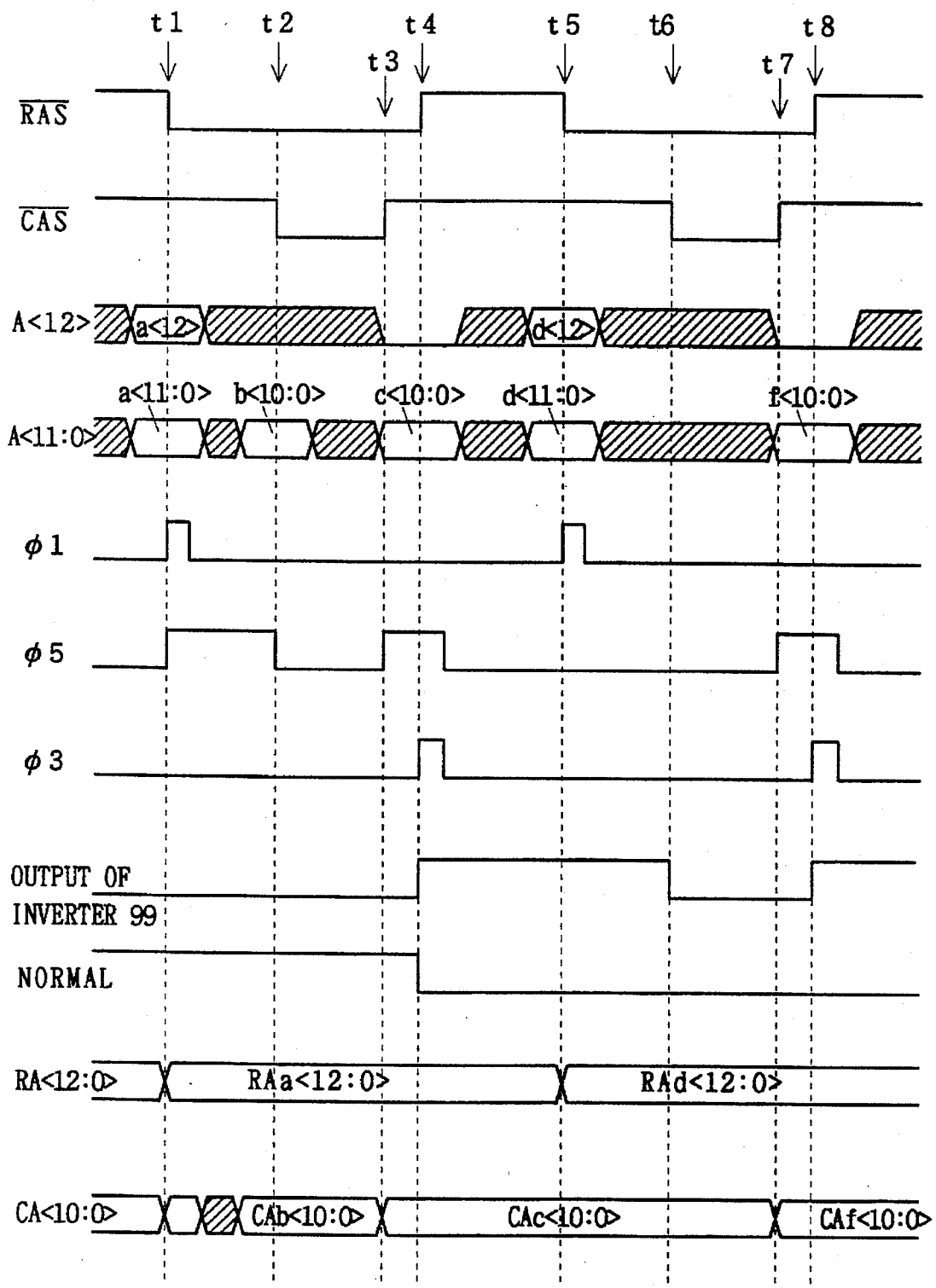
FIG. 16 is a timing chart showing the operation of the third preferred embodiment of the invention.
Figure 17:
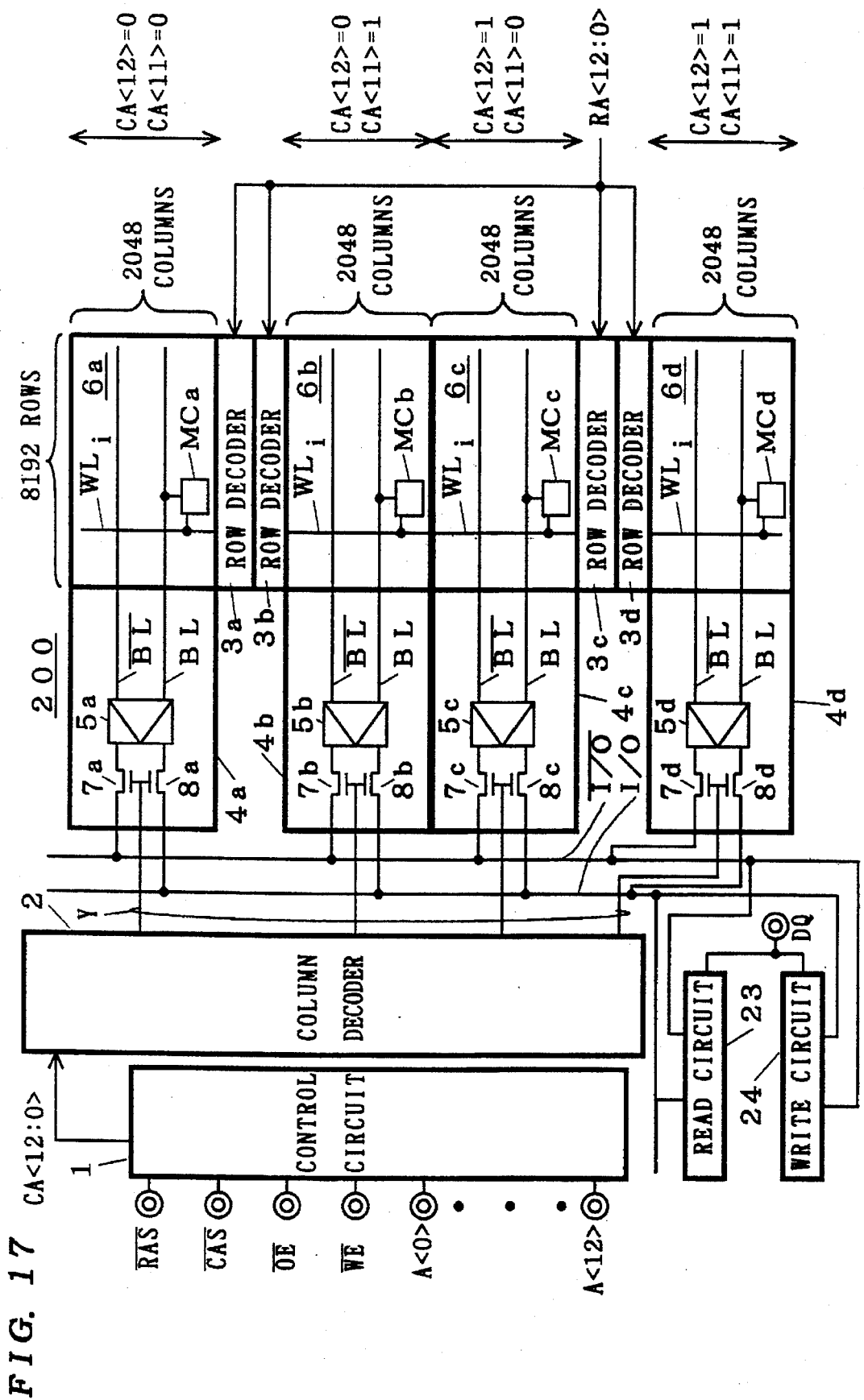
FIGS. 17 and 18 are circuit diagrams showing a prior art.
Figure 18:
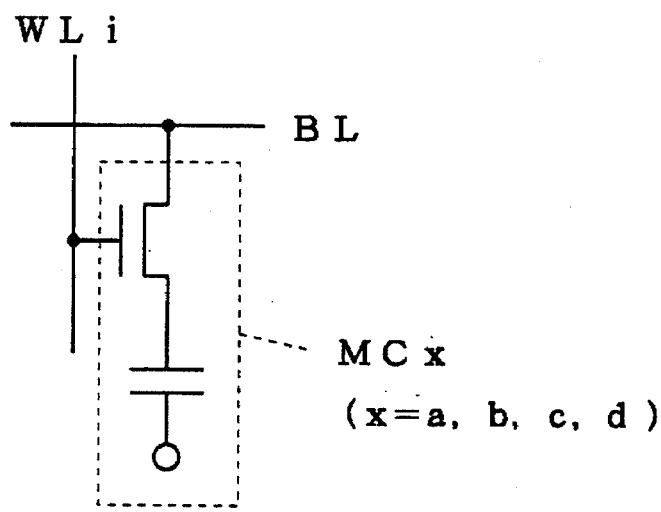

FIG. 16 is a timing chart showing the operation of the DRAM 101 in the third preferred embodiment. Time t1 to t8 is the same as shown in the first preferred embodiment in FIG. 5.

The ordinary operation is explained in the first place. The changeover signal NORMAL has a value of "H", and the flip-flop 91 is set, and the inverter 99 gives logic "L" to the OR gate 93. Accordingly, the OR gate 93 gives the logical sum of the control signal $\overline{RAS}$ and logical inversion of the control signal $\overline{CAS}$ to the NAND gate 92. Hence, when the control signal $\overline{RAS}$ is "H" as before time t1, the clock signal φ5 is always the same as the clock signal φ3. As explained in the first preferred embodiment, the clock signal φ3 is activated only for a specific period after rise of the control signal $\overline{RAS}$, and in FIG. 16, supposing enough time has passed since the rise of the control signal $\overline{RAS}$ before time t1, both clock signals φ3 and φ5 are "L".

When the control signal $\overline{RAS}$ falls before time t1, the clock signal φ1 is activated, and the clock signal generating unit 112 transmits the data a<12:0> given to the address pin A<12:0>. This is decoded by the row decoder 30x as a row address RAa<12:0>.

Besides, as the control signal $\overline{RAS}$ becomes "L", the OR gate 93 outputs the logical inversion of the control signal $\overline{CAS}$. Hence, the clock signal φ5 is the logical sum of the clock signal φ3 and the control signal $\overline{CAS}$, but since the clock signal φ3 remains at "L" as mentioned above, the clock signal φ5 coincides with the control signal $\overline{CAS}$ until the control signal $\overline{RAS}$ rises next at time t4.

Before time t2, the clock signal φ5 is already activated, and hence the address generating unit 113 transmits the data b<10:0> of 11 bits as a column address CAb<10:0>. At time t2, the control signal $\overline{CAS}$ falls, and they are decoded.

When the control signal $\overline{RAS}$ rises at time t4, the clock signal φ3 is activated for a specific period, and the clock signal generating unit 114 outputs the data given to the address pin A<12> as changeover signal NORMAL. At this time, by giving the logic "L" to the address pin A<12>, it causes to transfer to the power-saving operation.

At the same time, the column address c<10:0> can be given to the address pins A<10:0>. Different from the case of the first preferred embodiment, the specification of the column direction in the DRAM 101 requires only 11 bits, while giving the whole necessary column address to the address pins, the data as the basis of changeover signal can be given at the same time. Of course, the data as the basis of changeover signal can be given also to the address pin A<11>. In such a case, the address pin A<11> is connected to the address generating unit 114.

After time t4, the changeover signal NORMAL is "L". At this moment, the control signals $\overline{RAS}$ and $\overline{CAS}$ are both "H", and the flip-flop 91 is reset, and the output of the inverter 99 is "H". In such a state, the clock signal φ5 has the same waveform as the clock signal φ3.

The output of the inverter 99 is a logical inversion of the output of the flip-flop 91. Therefore, until the flip-flop 91 is set, the output of the inverter 99 is always "H", and the clock signal φ5 always coincides with the clock signal φ3.

In the "L" period of the changeover signal NORMAL, the flip-flop 91 is set when the control signal $\overline{CAS}$ becomes "L". Hence, after time t4, the clock signal φ5 is activated for a specific period, and holds in "L" state until the control signal $\overline{CAS}$ falls at time t6.

On the other hand, at time t5, the control signal $\overline{RAS}$ becomes "L", and the clock signal φ1 is activated for a specific time, and the data d<12:0> given to the address pins A<12:0> is taken in as row address. At this moment, the whole row and column addresses necessary for specifying the memory cell are obtained. Therefore, when the control signal $\overline{CAS}$ becomes "L" at time t6, it is not necessary to read in the column address newly. To the contrary, if the data given to the address pins A<12:0> is taken in just before time t6, the row address CAc<10:0> read in already will be destroyed.

Therefore, after obtaining the data d<12:0> as row address at time t5, until the control signal $\overline{CAS}$ is activated at time t6, the address generating circuit 11 must keep other value. In other words, all of clock signals φ1, φ3, φ5 must be "L".

After time 16, the output of the inverter 99 is "L", and the clock signal φ5 has the same value as the control signal $\overline{CAS}$ until the flip-flop 91 is reset by inactivation of the control signal $\overline{RAS}$ at time t8. Therefore, at time t7, as the control signal $\overline{CAS}$ becomes "H", the clock signal φ5 becomes "H".

On the other hand, if the control signal $\overline{RAS}$ is inactivated at time t8, the clock signal φ3 is activated to be "H", and the clock signal φ5 before and after time t8 remains to be "H". Hence, the address generating unit 13 outputs the data f<10:0> given to the address pins A<10:0> as the row address CAf<10:0>, and the address generating unit 114 outputs the changeover signal NORMAL on the basis of the data given to the address pin A<12>.

The address generating unit 114 transmits the data given to the address pin A<12> by the clock signal φ3, not by the clock signal φ5. If the operation of the address generating unit 114 is controlled by using the clock signal φ5, in the case of page mode operation by page hit, a new column address CA<10:0> is transmitted in the address generating unit 113 by inactivation of the control signal $\overline{CAS}$, and the data whose value is unknown, and which is given to the address pin A<12> is transmitted as changeover signal NORMAL. As a result, it is not guaranteed that the power-saving operation is done continuously in the page mode.

On the other hand, by controlling the address generating unit 114 by the clock signal φ3, that is, by transmitting the changeover signal NORMAL only in the case of page fault, the power-saving operation can be done continuously in the page mode.

In this way, according to the preferred embodiment, the required number of bits of the column address is smaller than that of the row address, and the changeover signal and a whole column address can be given simultaneously to the address pins corresponding to the row address, and it is not necessary to obtain the column address for updating the data as basis of the changeover signal after the row address.

According to the third preferred embodiment, in the semiconductor memory device comprising 64M of memory cells and 13 address pins, 2048 ($=2^{26}/2^{15}=2^{11}$) memory cells, which is decoded by 15 bits, a sum total of 2 bits out of 11 bits inputted when /RAS becomes "H" and 13 bits inputted when /RAS becomes "L", are selected.

The preferred embodiment relates to the 64M DRAM of 16M words×4 bits composition for reading out simultaneously the data stored in four memory cells out of memory cells of 64M bits, but it may be similarly applied to the 64M DRAM of 8M words×8 bits composition for reading out simultaneously the data stored in eight memory cells out of memory cells of 64M bits. Or it may be also applied to the composition of 32M words×2 bits.

Having also a constitution for specifying the column direction by the column address smaller than the row address by 1 bit, when the address pins are provided as many as a whole row address can be received at once, the data as basis of the changeover signal can be received simultaneously with a whole column address, so that the same effect as the preferred embodiment may be obtained.

While the invention has been shown and described in detail, the foregoing description is in all aspects illustrative and not restrictive. It is therefore understood that numerous modifications and variations can be devised without departing from the scope of the invention.

I claim:

1. A semiconductor memory device comprising:

m memory cells, where m is an integer;

n address pins, where n is an integer; and a row decoder for selecting a specific number of said memory cells out of said m memory cells, wherein said row decoder selects $m/2^k$ as said specific number of said memory cells based on a first signal of p bits, where p is an integer, input to said address pins at a time when a control signal for specifying a beginning and an end of access operation specifies said end of access operation, and a second signal of q bits, where q is an integer, input to said address pins at a time when said control signal specifies said beginning of access operation, and a third signal of k bits composed of said first signal and said second signal, where k is an integer, and a sum of p and q, indicating an address for the memory cells selected by said row decoder.

2. A semiconductor memory device comprising:

m memory cells, where m is an integer;

n address pins, where n is an integer;

a row decoder for selecting a specific number of said memory cells out of said m memory cells; and a mode changeover circuit for changing over an operation mode of the semiconductor memory between first and second modes;

wherein said row decoder selects:

in said first mode, $m/2^n$ as said specific number of said memory cells based on a first signal of n bits input to said address pins at a time when a control signal for specifying a beginning and an end of access operation specifies said beginning of access operation; and in said second mode, $m/2^k$ as said specific number of said memory cells based on a second signal of p bits, where p is an integer, input to said address pins at a time when said control signal for specifying a beginning and an end of access operation, and a third signal of q bits, where q is an integer, input to said address pins at a time when said control signal specifies said beginning of access operation, and a fourth signal of k bits composed of said second signal and said third signal, where k is an integer and a sum of p and q, indicating an address for the memory cells selected by said row decoder.

3. The semiconductor memory device of claim 2, wherein said mode changeover circuit regulates an operation mode for a period from a time when said control signal specifies a beginning of a next access operation to an end of the access operation in said semiconductor memory device, according to a state of a fifth signal applied to said semiconductor memory device at a time when said control signal specifies said end of access operation.

4. A signal processing device comprising:

m memory cells, where m is an integer;

n address pins, where n is an integer;

a row decoder for selecting a specific number of said memory cells out of said m memory cells; and a mode changeover circuit for changing over an operation mode of the semiconductor memory between first and second modes;

wherein said row decoder selects:

in said first mode, $m/2^n$ as said specific number of said memory cells based on a first signal of n bits input to said address pins at a time when a control signal for specifying a beginning and an end of access operation specifies said beginning of access operation; and in said second mode, $m/2^k$ as said specific number of said memory cells based on a second signal of p bits, where p is an integer, input to said address pins at a time when said control signal specifies said end of access operation, and a third signal of q bits, where q is an integer, input to said address pins at a time when said control signal specifies said beginning of access operation, and a fourth signal of k bits composed of said second signal and said third signal, where k is an integer and a sum of p and g, indicating an address for the memory cells selected by said row decoder;

a logic LSI; and a control device for controlling said semiconductor memory device in accordance with a request of said logic LSI, wherein said control device operates said semiconductor memory device in said first mode in response to a first request for memory access of said logic LSI, and operates said semiconductor memory device in said second mode in response to a next request for memory access.

* * * * *